US010302717B2

(12) United States Patent
Bouleau et al.

(10) Patent No.: US 10,302,717 B2
(45) Date of Patent: *May 28, 2019

(54) NUCLEAR MAGNETIC RESONANCE ANALYSIS PROBE, DEVICE AND METHOD

(71) Applicant: COMMISSARIAT A L'ENERGIE ATOMIQUE ET AUX ENERGIES ALTERNATIVES, Paris (FR)

(72) Inventors: Eric Bouleau, Sassenage (FR); Gaël De Paëpe, Voiron (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 651 days.

This patent is subject to a terminal disclaimer.

(21) Appl. No.: 14/655,919

(22) PCT Filed: Dec. 27, 2013

(86) PCT No.: PCT/EP2013/078081
§ 371 (c)(1),
(2) Date: Jun. 26, 2015

(87) PCT Pub. No.: WO2014/102348
PCT Pub. Date: Jul. 3, 2014

(65) Prior Publication Data
US 2015/0338480 A1 Nov. 26, 2015

(30) Foreign Application Priority Data
Dec. 27, 2012 (FR) .................................... 12 62889

(51) Int. Cl.
*G01R 33/38* (2006.01)
*G01R 33/30* (2006.01)
*G01R 33/31* (2006.01)

(52) U.S. Cl.
CPC ....... *G01R 33/3804* (2013.01); *G01R 33/307* (2013.01); *G01R 33/31* (2013.01)

(58) Field of Classification Search
CPC .. G01R 33/3804; G01R 33/307; G01R 33/31; G01R 33/34046; G01R 33/3415; G01R 33/385; G01R 33/341; G01R 33/34007
See application file for complete search history.

(56) References Cited

U.S. PATENT DOCUMENTS

| 4,940,942 A | 7/1990 | Bartuska et al. |
| 5,192,910 A | 3/1993 | Hepp et al. |
| (Continued) | | |

OTHER PUBLICATIONS

Mizuno et al., "Development of a magic-angle spinning nuclear magnetic resonance probe with a cryogenic detection system for sensitivity enhancement", Review of Scientific Instruments, vol. 79, 044706, 2008, 6 pages; cited in the International Search Report.

(Continued)

*Primary Examiner* — Jermele M Hollington
*Assistant Examiner* — Suresh K Rajaputra
(74) *Attorney, Agent, or Firm* — Westerman, Hattori, Daniels & Adrian, LLP

(57) ABSTRACT

The invention relates to an NMR analysis device (7) comprising an NMR analysis probe (9) and a cryostat (8) linked by a cryogenic line (16), the probe (9) comprising
a frame;
a sample-holder (12) comprising a rotor (31), suitable for receiving a sample of material (15) to be analyzed;
a bearing (13) for rotationally guiding the sample-holder (12) relative to the frame;
the device further comprising a compression module (10) and a cryorefrigerator (11) arranged in the cryostat (8), the cryorefrigerator being upstream of the compression module, and in that the analysis device (7) comprises a first element (22) for channelling a third gaseous flow (M3) of (Continued)

fluid to a turbine (14) and a second element (21) for channelling a second gaseous flow of fluid (M2) to the bearing (13), the bearing (13) being of aerostatic or aerodynamic type.

19 Claims, 14 Drawing Sheets

(56) References Cited

U.S. PATENT DOCUMENTS

| | | | | |
|---|---|---|---|---|
| 5,289,130 | A * | 2/1994 | Doty | G01R 33/307 |
| | | | | 324/307 |
| 5,508,615 | A * | 4/1996 | Doty | G01R 33/307 |
| | | | | 324/318 |
| 5,744,959 | A | 4/1998 | Jeker et al. | |
| 5,887,449 | A * | 3/1999 | Pecharsky | F25B 21/00 |
| | | | | 62/3.1 |
| 6,828,889 | B1 | 12/2004 | Zaput | |
| 2004/0222796 | A1 | 11/2004 | Munson et al. | |
| 2006/0097146 | A1 * | 5/2006 | Strobel | F25B 9/02 |
| | | | | 250/286 |
| 2006/0176056 | A1 * | 8/2006 | Doty | G01R 33/307 |
| | | | | 324/321 |
| 2008/0150536 | A1 | 6/2008 | Withers | |
| 2010/0026302 | A1 | 2/2010 | Doty et al. | |
| 2010/0109666 | A1 | 5/2010 | Armbruster et al. | |
| 2011/0241674 | A1 | 10/2011 | Endo et al. | |
| 2015/0048829 | A1 * | 2/2015 | De Paepe | G01R 33/307 |
| | | | | 324/321 |
| 2015/0177341 | A1 * | 6/2015 | De Paepe | G01R 33/305 |
| | | | | 324/309 |

OTHER PUBLICATIONS

Hackmann et al., "Magic-Angle Spinning NMR at Near-Liquid-Helium Temperatures", Journal of Magnetic Resonance, vol. 79, 1988, pp. 148-153; cited in the International Search Report.

International Search Report and Written Opinion dated Jun. 2, 2014, issued in corresponding application No. PCT/EP2013/078081; w/English partial translation and partial machine translation (19 pages).

International Search Report and Written Opinion dated Jun. 10, 2014, issued in international application No. PCT/EP2013/078080 corresponding to co-pending U.S. Appl. No. 14/655,913; w/English partial translation and partial machine translation (19 pages) (U.S. Pat. No. 5,289,130, U.S. Pat. No. 5,508,615 and Mizuno publication cited in ISR are not listed in this IDS since they were already listed in the IDS filed with this US application on Jun. 26, 2015).

Office Action dated Dec. 7, 2017 in co-pending U.S. Appl. No. 14/655,913; with PTO892, without returned SB08 (11 pages).

* cited by examiner

NUCLEAR MAGNETIC RESONANCE ANALYSIS PROBE, DEVICE AND METHOD

TECHNICAL FIELD OF THE INVENTION

The present invention relates to a nuclear magnetic resonance (NMR) analysis probe, particularly suited to the analysis of samples of material, with a cryostat for an NMR analysis device and with an NMR analysis device. The invention also relates to a method for operating an NMR analysis device.

STATE OF THE ART

In the prior art, an NMR device comprises a probe comprising a sample-holder rotated in a static magnetic field and exposed to a second magnetic field at right angles to the first, for example created by a radiofrequency coil, which receives in return a signal which is analysed to deduce therefrom information concerning a sample, notably a solid sample, arranged in the sample-holder. According to a prior art embodiment, three gaseous flows originating for example from one and the same source, a standard container such as a helium bottle fitted under pressure, are directed to the probe of the device which comprises the sample-holder. The function of the first flow is to rotate this sample-holder, by acting on the blades or fins of a turbine driving a rotor (or rotation module) which comprises the sample-holder. The function of the second flow is to bring the sample to a certain temperature, and the third flow creates a bearing for sustaining or guiding the rotor in the stator.

In such an NMR device, it is important to define a probe architecture which guarantees that an ad-hoc temperature is obtained at the level of the sample-holder to achieve very low desired temperatures and/or to not consume too much energy in lowering them.

To do this, it is known practice to make use of techniques of heat insulation of the constituent elements of such NMR devices so as to protect them from the surrounding thermal radiation and avoid the losses through convection or through radiation, even through conduction.

However, such techniques remain imperfect and inadequate for maintaining the NMR devices at very low temperatures.

The present invention aims to resolve these problems resulting from the shortcomings of the prior art.

DISCLOSURE OF THE INVENTION

The invention aims to provide an NMR analysis device that makes it possible to remedy the problems stated previously and improve the devices known from the prior art.

In particular, the invention proposes an NMR analysis device operating at very low temperature by consuming little energy, and that makes it possible to minimize the size of the heat exchanger contained in the cryostat.

Furthermore, one of the advantages of the invention is that it simplifies the NMR analysis device compared to the configuration comprising so-called hot compressors.

According to a first aspect, the invention relates to an NMR analysis probe, comprising:
- a frame;
- a sample-holder comprising a rotor, suitable for receiving a sample of material to be analysed;
- a bearing for rotationally guiding the sample-holder relative to the frame;

the probe comprising a turbine kinematically linked with the rotor, the turbine having a geometry such that it allows an isentropic expansion of a third fluid M3 which passes through it and in that a fourth channelling element is able to recover a fourth gaseous flow M4 of fluid leaving downstream from the expansion turbine and/or a sixth gaseous flow M6 of fluid leaving downstream from the rotor and stator of the sample-holder.

According to particular embodiments, the probe comprises:
- a first element for channelling a third gaseous flow M3 of fluid to the turbine and a second element for channelling a second gaseous flow of fluid M2 to the bearing, the bearing being of aerostatic or aerodynamic type, and
- a third element for channelling a first gaseous flow M1 of fluid to the sample-holder, the function of this flow being to cool the sample-holder and/or the sample.

According to a second aspect, the invention also relates to an NMR analysis device comprising a probe, a compression module and a second heat exchanger, in which first and second gaseous flows M1, M2 transfer, respectively upstream of the bearing and of the sample-holder, heat to the fourth M4 and/or sixth M6 gaseous flows.

According to particular embodiments:
- the device comprises a first heat exchanger in which first, second and third gaseous flows M1, M2, M3 transfer heat to a seventh gaseous flow M7;
- the device comprises a cryorefrigerator arranged between the first and second exchangers;
- the first and second exchangers are counter-current exchangers between the high-pressure first, second and third gaseous flows M1, M2, M3 and the fourth, sixth and seventh gaseous flows M4, M6, M7;
- the device comprises a cryostat comprising the cryorefrigerator, the first and second exchangers and in particular the compression module;
- the device comprises a third heat exchanger arranged outside the cryostat, and
- the device is configured to perform a Brayton thermodynamic cycle.

According to a third aspect, the invention also relates to a method for analysing by NMR a solid sample arranged in a sample-holder comprising the following steps:
- generation of high-pressure first, second and third gaseous flows M1, M2, M3 from at least one high-pressure gaseous fluid M0;
- creation of a bearing for guiding the sample-holder by a cooled high-pressure second gaseous flow M2, rotation of the sample-holder by a cooled high-pressure third gaseous flow M3 and cooling of the sample-holder by a cooled high-pressure first gaseous flow M1, the method comprising a step of transfer of heat by the first and second gaseous flows M1, M2 respectively upstream of the bearing and of the sample-holder, to a fourth M4 and/or a sixth M6 gaseous flow made up of a fourth gaseous flow M4 downstream of an expansion turbine which also drives the sample-holder.

Advantageously, the method comprises a step of generation of the fourth gaseous flow M4 by the expansion of the fluid of this high-pressure third gaseous flow M3 in the turbine, the expansion being isentropic, notably in a turbine having a geometry such that it allows an isentropic expansion.

According to a fourth aspect, the invention relates to an NMR analysis device comprising an NMR analysis probe and a cryostat linked by a cryogenic line, the probe comprising:
- a frame;
- a sample-holder comprising a rotor, suitable for receiving a sample of material to be analysed;
- a bearing for rotationally guiding the sample-holder relative to the frame, the probe further comprising a compression module and a cryorefrigerator arranged in the cryostat, the cryorefrigerator being upstream of the compression module, and the analysis device comprises a first element for channelling a third gaseous flow M3 of fluid to a turbine and a second element for channelling a second gaseous flow of fluid M2 to the bearing, the bearing being of aerostatic or aerodynamic type.

According to particular embodiments:
- the analysis device comprises a third element for channelling a first gaseous flow M1 of fluid to the sample-holder, the function of this flow being to cool the sample-holder and/or the sample;
- the analysis device comprises, in the cryostat, a first heat exchanger in which the first, second and third gaseous flows M1, M2, M3 transfer heat to a seventh gaseous flow M7;
- the analysis device comprises, in the cryostat, a second heat exchanger in which first and second gaseous flows M1, M2 transfer, respectively upstream of the bearing and of the sample-holder, heat to a fourth M4 or sixth M6 gaseous flow made up of a fourth gaseous flow M4 downstream of the turbine forming an expansion unit mounted kinematically linked with the sample-holder;
- the cryorefrigerator is arranged between the first and second exchangers;
- the analysis device comprises a fourth element for channelling a fourth gaseous flow M4 of fluid downstream of the expansion turbine;
- the first and second exchangers are counter-current exchangers between the high-pressure first, second and third gaseous flows M1, M2, M3 and the fourth, sixth and seventh gaseous flows M4, M6, M7;
- the analysis device is configured to perform a Brayton thermodynamic cycle;
- the turbine is an isentropic expansion turbine having a geometry such that it allows an isentropic expansion of the fluid which passes through it, and
- the analysis device comprises a fourth element for channelling a sixth gaseous flow M6 of fluid downstream of the rotor and stator of the sample-holder.

According to a fifth aspect, the invention relates to a method for operating an NMR analysis device comprising a circuit comprising an NMR analysis probe and a cryostat linked by a cryogenic line, and this method comprises a step of configuration of this circuit through which fluid flows M0 to M9 circulate, said configuration step comprising an implementation of different modes of operation of the device, according to the activation/deactivation of redirection elements VC1, VC2, VC3, VC4 and/or to the closed/open mode configuration of loop elements A1 to A11 of this circuit.

According to particular embodiments:
- the different modes of operation are defined by different structures of the fluid circulation circuit;
- each different mode of operation is associated with a different fluid circulation circuit structure;
- each circuit structure is defined by states or configurations of different loop elements A1 to A11 and/or of different redirection elements VC1, VC2, VC3, VC4;
- the operating method comprising a step of implementation of at least:
  - one first mode of operation;
  - one second mode of operation;
  - one third mode of operation;
  - one fourth mode of operation, and
  - one fifth mode of operation.
- The step of implementation of at least one first mode of operation of the analysis device comprises a closed mode configuration of a first set of loop elements A1, A2, A3, A7;
- the step of implementation of at least one second mode of operation of the analysis device comprises a closed mode configuration of a second set of loop elements A2, A3, A4, A5;
- the step of implementation of at least one third mode of operation of the analysis device comprises a closed mode configuration of a third set of elements A4, A5, A6;
- the step of implementation of at least one fourth mode of operation of the analysis device comprises a closed mode configuration of a fourth set of loop elements A6, A5, A8, and
- the step of implementation of at least one fifth mode of operation of the analysis device comprises an activation of a fifth set of redirection elements VC1, VC2, VC3, VC4 and a closed mode configuration of a sixth set of loop elements A1, A7.

According to a sixth aspect, the invention relates to an NMR analysis device comprising an NMR analysis probe and a cryostat linked by a cryogenic line, comprising hardware and/or software elements for implementing the operating method according to the fifth aspect of the invention.

According to particular embodiments:
- the hardware and/or software elements comprise loop elements A1 to A11;
- the cryostat comprises a heat exchanger provided with at least one first inlet, one second inlet, one third inlet, one fourth inlet, one first outlet, one second outlet, one third outlet and one fourth outlet, a compressor being intended to be arranged between the first inlet and the second outlet, the cryostat comprising redirection elements VC1, VC2, VC3, VC4 from the first outlet on the second inlet and elements for connecting an NMR analysis probe between the first outlet and the second inlet;
- the redirection elements VC1, VC2, VC3, VC4 comprise valves with at least two ways;
- the loop elements A1 to A11 comprise two-way valves, and
- the hardware and/or software elements comprise a central processing unit likely to control the loop elements A1 to A11 and the redirection elements VC1, VC2, VC3, VC4.

According to a seventh aspect, the invention relates to a cryostat comprising a heat exchanger provided with at least one first inlet, one second inlet, one third inlet, one fourth inlet, one first outlet and one second outlet, one third outlet and one fourth outlet, a compressor being intended to be arranged between the first inlet and the second outlet, the cryostat comprising redirection elements from the first outlet on the second inlet and elements for connecting an NMR analysis probe between the first outlet and the second inlet.

Save for any technical or logical incompatibility, these various aspects can be combined freely with one another.

DESCRIPTION OF THE FIGURES

Other advantages and features of the invention will become more apparent on reading the following description of a preferred embodiment, with reference to the figures below, given as an indicative and nonlimiting example.

EMBODIMENTS OF THE INVENTION

Figure 1:
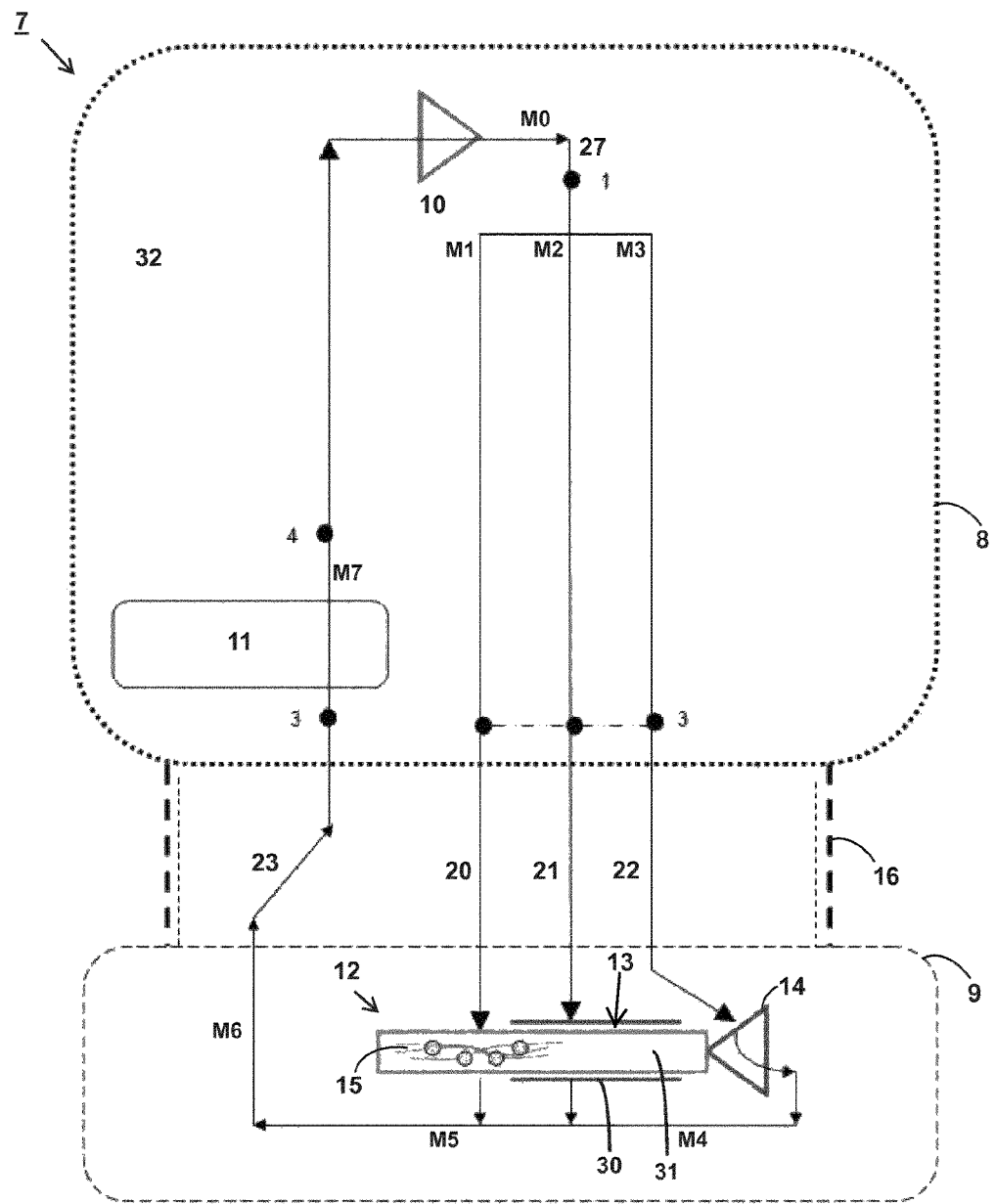
FIG. 1 represents an NMR analysis device according to a first embodiment of the invention.

In the description, the following notations will be adopted for:
the first gaseous flow: gaseous flow M1;
the second gaseous flow: gaseous flow M2;
the third gaseous flow: gaseous flow M3;
the fourth gaseous flow: gaseous flow M4;
the fifth gaseous flow: gaseous flow M5;
the sixth gaseous flow: gaseous flow M6;
the seventh gaseous flow: gaseous flow M7;
the eighth gaseous flow: gaseous flow M8, and
the ninth gaseous flow: gaseous flow M9.

In FIGS. 1 to 8, the NMR analysis device 7 comprises, non-exhaustively and in a nonlimiting manner, the following components:
a compression module 10, corresponding, for example, to at least one compressor of compressor-circulator type;
a cryostat 8;
a cryorefrigerator 11, and
an NMR analysis probe 9.

Components such as a cryogenic line 16 or even at least one first 18, one second 19 and one third 17 heat exchanger can, optionally, be added to this NMR analysis device 7.

Figure 3:
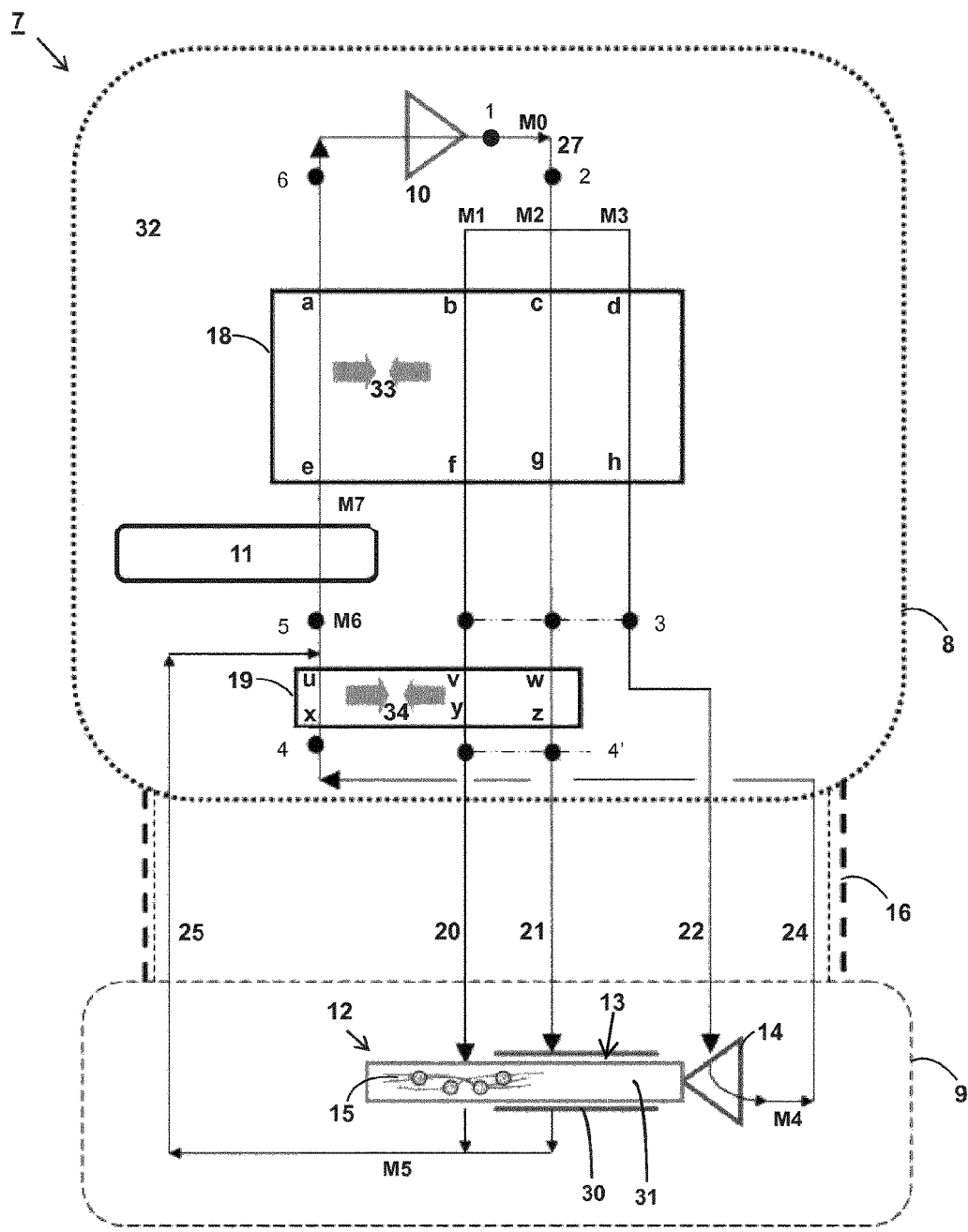
FIG. 3 represents an NMR analysis device according to a third embodiment of the invention.
Figure 4:
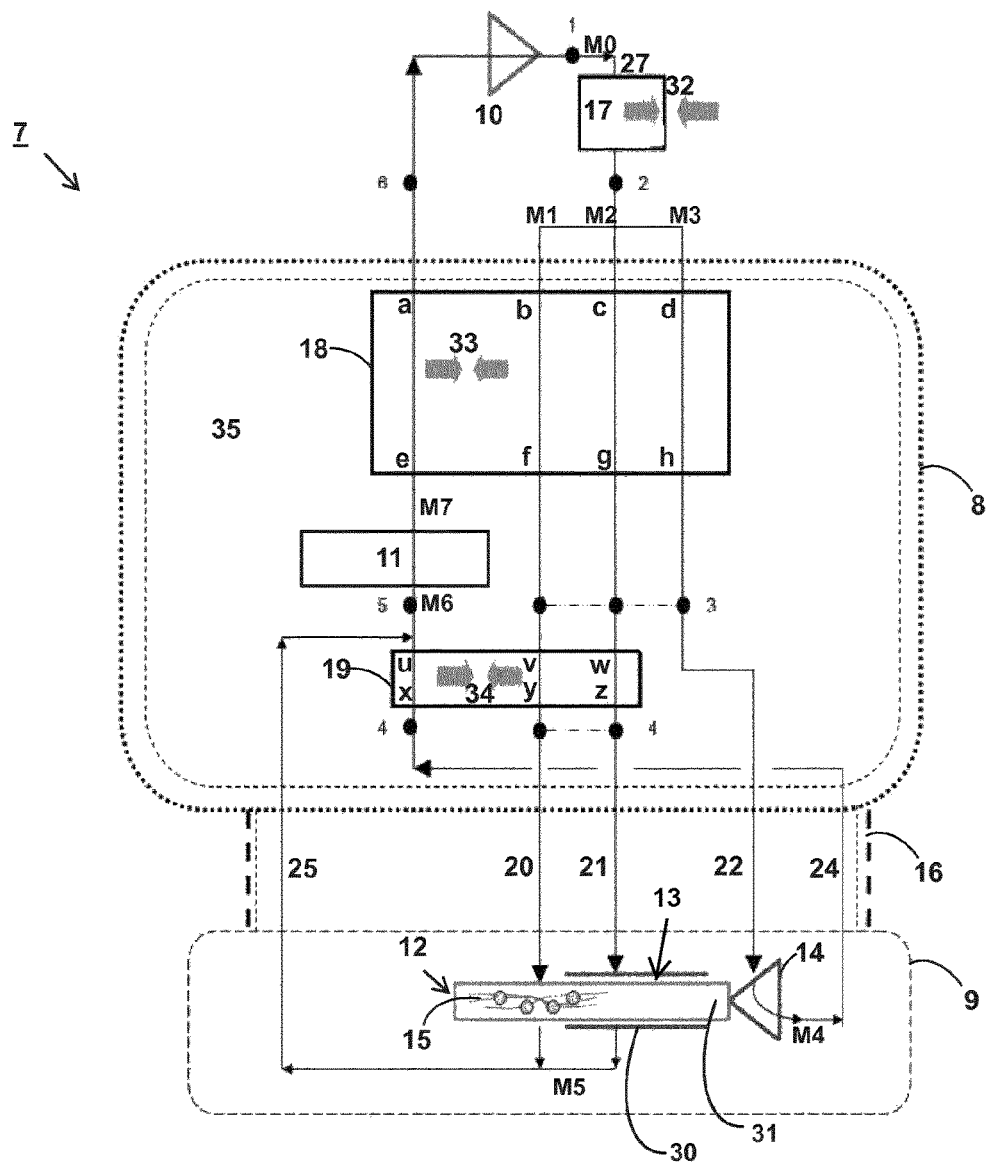
FIG. 4 represents an NMR analysis device according to a fourth embodiment of the invention.
Figure 5:
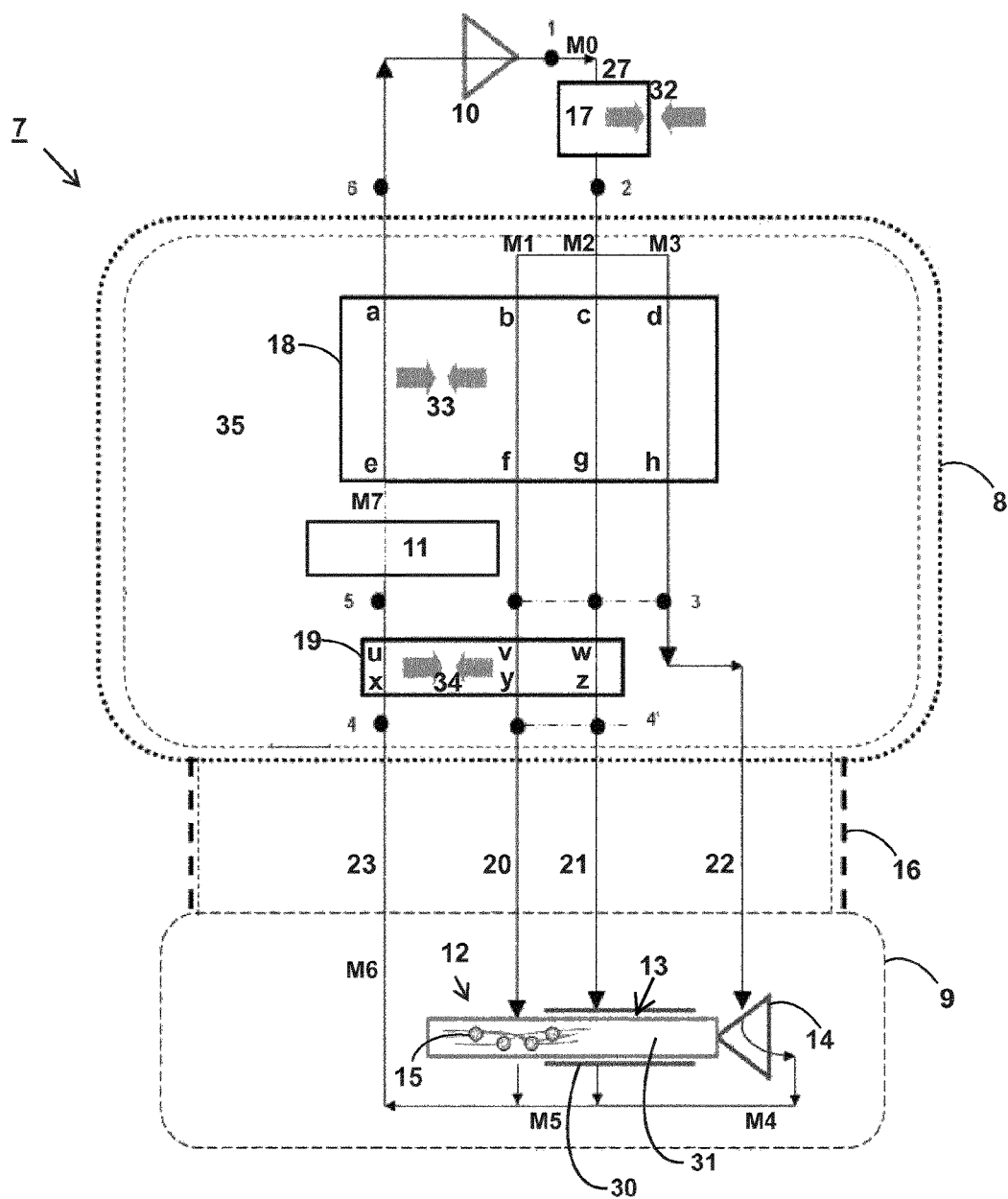
FIG. 5 describes an NMR analysis device according to a fifth embodiment of the invention.

Furthermore, in certain embodiments of the device 7, notably illustrated in FIGS. 3, 4 and 5, the device can comprise a turbine 14 which can produce an expansion in a thermodynamic cycle of Brayton type. This turbine rotationally drives the sample-holder 12 of the probe 9. This turbine 14 is therefore kinematically linked with the sample-holder 12.

Figure 6:
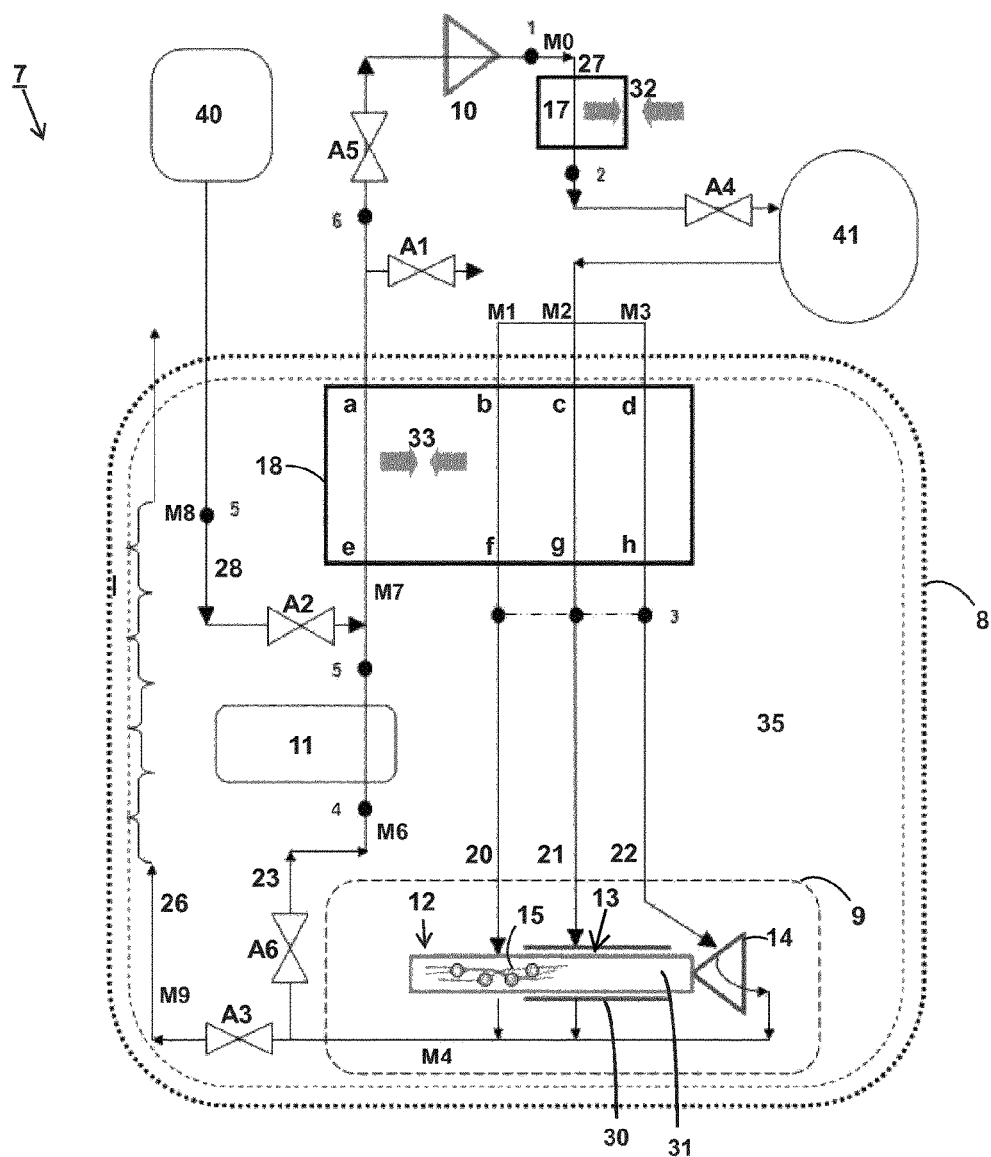
FIG. 6 represents an NMR analysis device according to a sixth embodiment of the invention.
Figure 7:
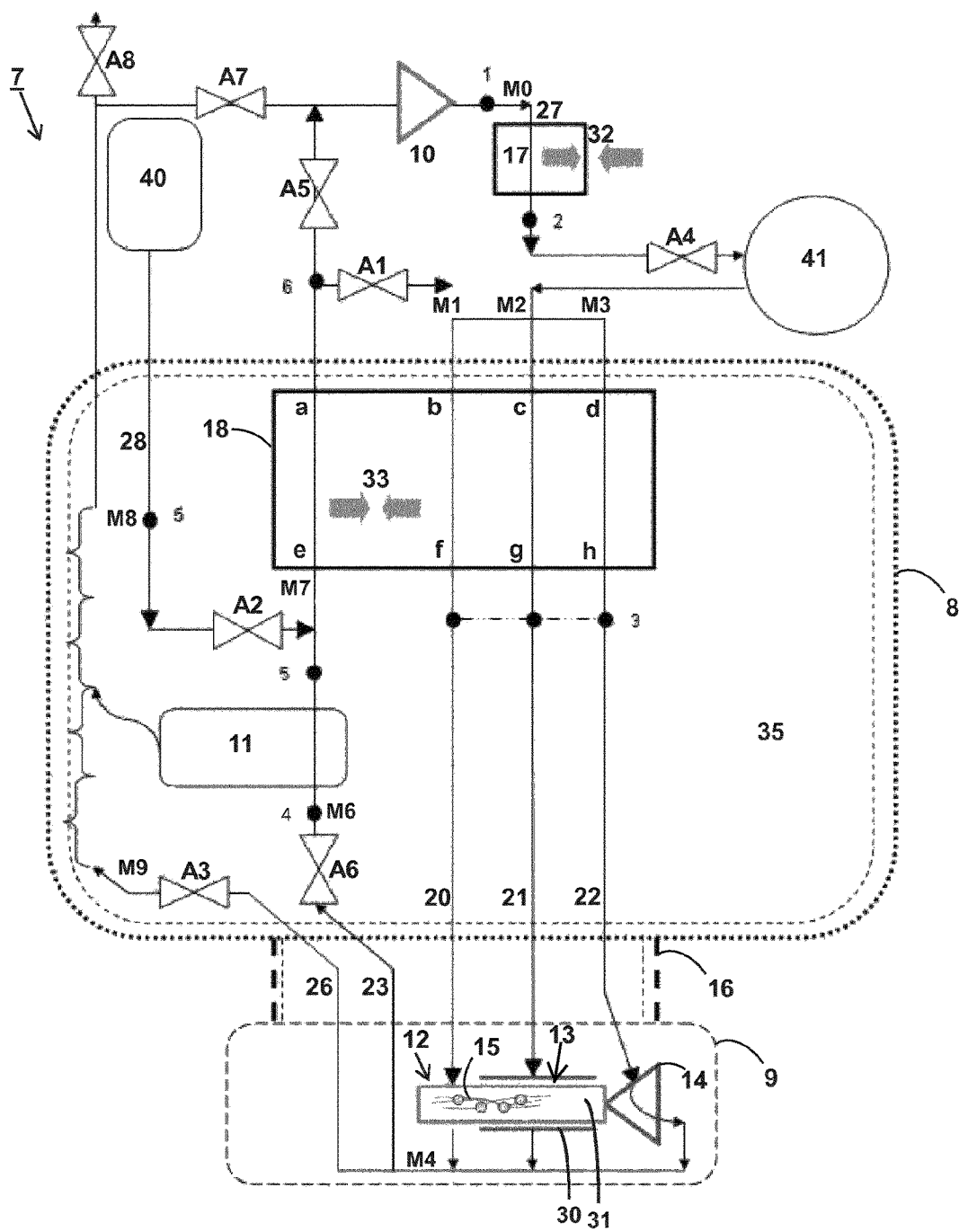
FIG. 7 describes an NMR analysis device according to a seventh embodiment of the invention.
Figure 8:
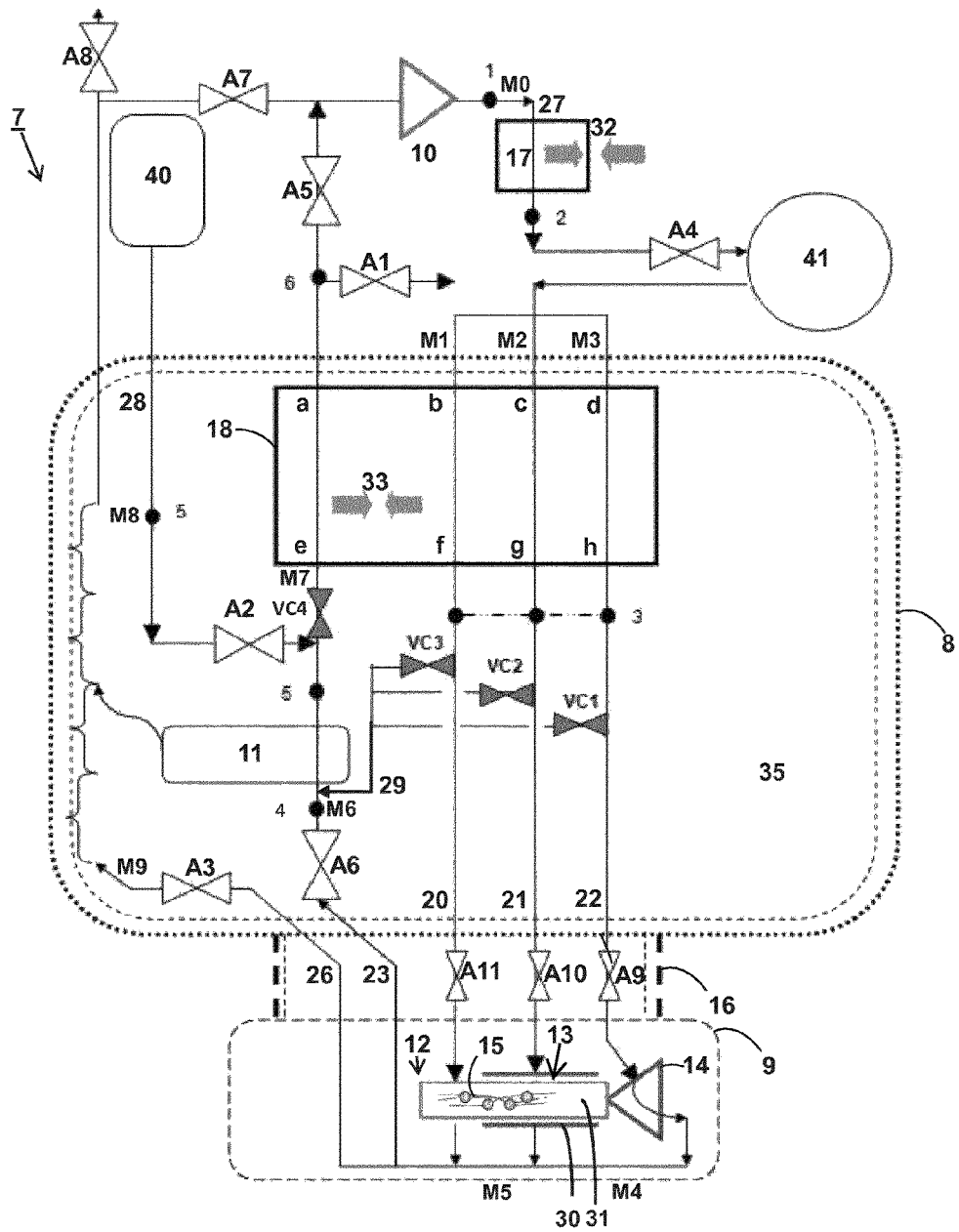
FIG. 8 represents an NMR analysis device according to an eighth embodiment of the invention.

In certain embodiments illustrated in FIGS. 6 to 8, other components can also be arranged in this NMR analysis device 7, such as, for example:
channelling elements 21, 22, 23, 24, 25, 26, 27, 28, 29;
valves A1, A2, A3, A4, A5, A6, A7, A8, A9, A10, A11 of two-way valve type;
redirection elements VC1, VC2, VC3, VC4, of cryogenic valve type or else valves with at least two ways;
a high-pressure fluid storage unit 41, and
an external cryogenic fluid source 40 such as, for example, a Dewar situated outside the device 7.

These different components of the NMR analysis device 7 are arranged to form a circuit corresponding to a cold closed and pressurized loop making it possible to ensure motive and refrigerant flow rates for a solid sample-holder 12 in rotation in an NMR analysis probe 9.

In this NMR analysis device 7, the compression module 10 can be situated in the cryostat 8 or outside of the cryostat 8.

This compression module 10 is arranged in the pressurized closed loop so as to ensure the circulation of the motive and refrigerant fluids in this loop.

The function of this compression module 10 is notably to define the flow rate of a gaseous fluid M0, said flow rate being chosen by acting on a regulation valve. The definition of this flow rate makes it possible for example to choose the speed of rotation of the sample-holder 12. This gaseous fluid M0 corresponds, in a nonlimiting and nonexhaustive manner, to helium or even to nitrogen.

In the circuit of this device 7, different gaseous flows are implemented so as to describe the travel of the gaseous fluid M0.

These gaseous flows are as follows:
the high-pressure (HP) gaseous flows M1, M2, M3 originating from the division of the gaseous fluid M0 into three distinct gaseous flows which will pass through the cryostat 8 in order to be cooled and conducted to the NMR analysis probe 9;
the low-pressure (LP) gaseous flow M4 corresponding to the gaseous flow resulting from the gaseous flow M3 having rotated the sample-holder 12;
the low-pressure (LP) gaseous flow M5 corresponding to the gaseous flows resulting from the gaseous flows M1, M2 having respectively raised the sample to a certain temperature and created an aerostatic or aerodynamic bearing 13 for supporting or guiding the rotor 31 in the stator 30;
the low-pressure (LP) gaseous flow M6 which is formed by the low-pressure gaseous flows M4 and M5 recovered at the level of the rotor 31 and stator 30 of the sample-holder 12, and
the low-pressure gaseous flow M7 corresponding to the gaseous flows resulting from the low-pressure gaseous flow M6 passing through the cryorefrigerator 11.

In the embodiments of the NMR analysis device 7 illustrated in FIGS. 3, 4 and 5, when its components are configured to perform a Brayton thermodynamic cycle, the low-pressure (LP) gaseous flow M6 can be formed by the low-pressure gaseous flows M4 and M5 recovered at the level of the rotor 31 and stator 30 of the sample-holder 12 as seen previously, but it can also be formed by the gaseous flow M5 and a flow resulting from the gaseous flow M4 passing through at least one heat exchanger, such as the second exchanger 19. When the low-pressure (LP) gaseous flow M6 is formed by the gaseous flows M4 and M5, the gaseous flow M7 can result from the gaseous flow resulting from the passage of the low-pressure gaseous flow M6 through the second heat exchanger 19 passing through the cryorefrigerator 11.

In certain embodiments illustrated in FIGS. 6 to 8, in which components such as, notably, valves and/or redirection elements, are arranged on some of these channelling elements, other gaseous flows are described, such as, for example, a gaseous flow M8 of cryogenic fluid emanating from a cryogenic fluid source 40 and a gaseous flow M9 which is likely to be formed by the low-pressure gaseous flows M4 and M5 recovered at the level of the rotor 31 and stator 30 of the sample-holder 12. It will be noted that, in variants of these embodiments, the gaseous flow M7 can correspond to the gaseous flow M8.

Figure 12:
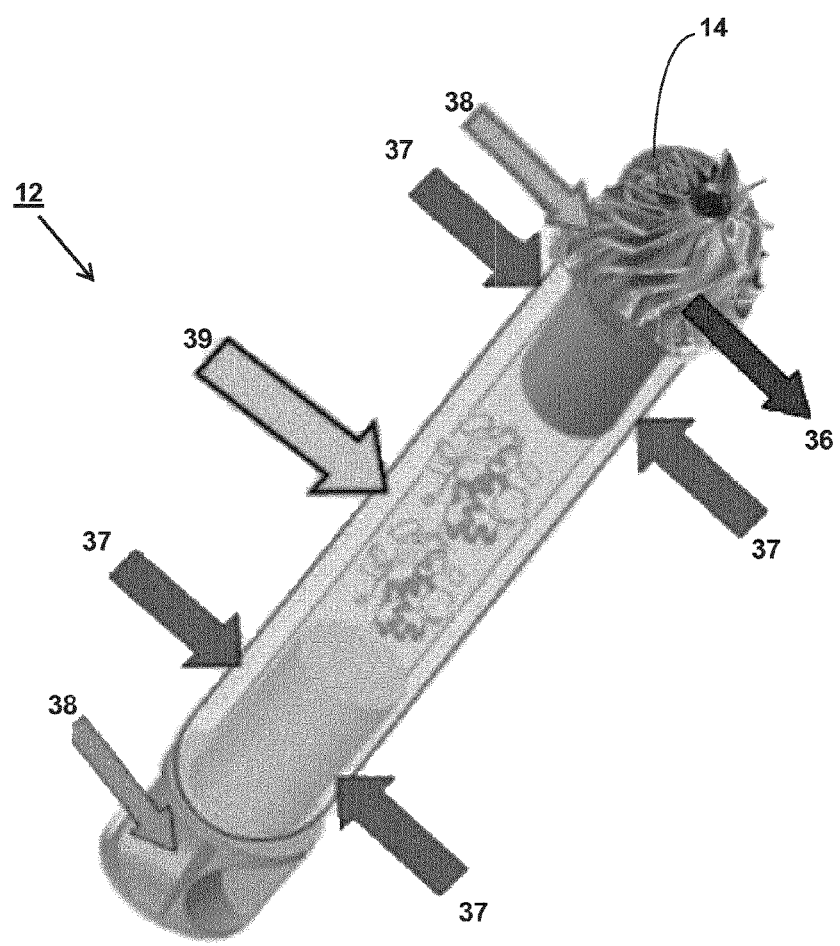
FIG. 12 represents an exemplary sample-holder.

As illustrated in FIG. 12, the high-pressure gaseous flows M1, M2, M3 might reach the NMR analysis probe 9 by being cooled substantially to the same temperature, and then fulfil the following functions:
- the high-pressure gaseous flow M1 cools the sample-holder 12 and/or the sample as specified by the arrow 39;
- the high-pressure gaseous flow M2 ensures the supporting or the guiding of the revolving sample-holder 12 as specified by the arrows 37, at the level of the bearing 13, and
- the high-pressure gaseous flow M3 rotates the sample by acting on the blades or fins of the turbine 14 as illustrated by the arrows 38.

The arrow 36 illustrates the production of the cold at the level of the turbine 14 configured to perform a Brayton thermodynamic cycle. This turbine, in addition to rotating the sample-holder 12, also makes it possible to increase the cooling capacity of the cryostat 8.

This NMR analysis device 7 also comprises a cryostat 8. The latter takes the form of a vacuum chamber 35 closed by a removable plate which offers access to its internal part. On this plate, inlet and outlet connectors are arranged to allow for the passage of the fluids mentioned above and allowing links to be run between data communication devices and, for example, a central processing unit, and pressure, temperature, rotor frequency, and electrical power sensors.

In the chamber 35 of this cryostat 8, a dynamic vacuum of the order of $10^{-5}$ mbar is maintained to minimize the thermal losses by gaseous convection and conduction.

All the components located inside the cryostat 8 are fixed mechanically by parts made from a material of very low thermal conductivity, which limits the thermal leaks by thermal conduction.

These components are, furthermore, protected from the ambient radiation emitted by the internal surface of the vacuum chamber, approximately at 300 K, by a thermal screen kept at low temperature by a circulation of refrigerated fluid that is sufficiently powerful to bring the thermal screen of the cryostat 8 to an intermediate temperature between the ambient temperature of the vacuum chamber 35 and the coldest temperature of the cryostat 8.

The vacuum chamber 35 is produced from a weakly magnetic material, and its thermal screen is produced from a metal material that is a very good thermal conductor.

The insulation of the chamber 35 can be obtained by a covering of a super-insulator such as that produced from MLI, which stands for "Multi Layer Insulation".

All of the components contained in the cryostat 8 are inserted into a vacuum chamber 35 provided with "vacuum-tight" passages through which the ancillaries useful to the operation of the probe (fluids, instrumentation signals, power) run.

In FIGS. 4 to 8, when the compression module 10 is a hot compressor, that is to say situated outside of the cryostat 8, the cryostat 8 then comprises at least one heat exchanger and at least one cryorefrigerator 11. Alternatively, the cryostat 8 can also additionally comprise the NMR analysis probe 9.

Figure 2A:
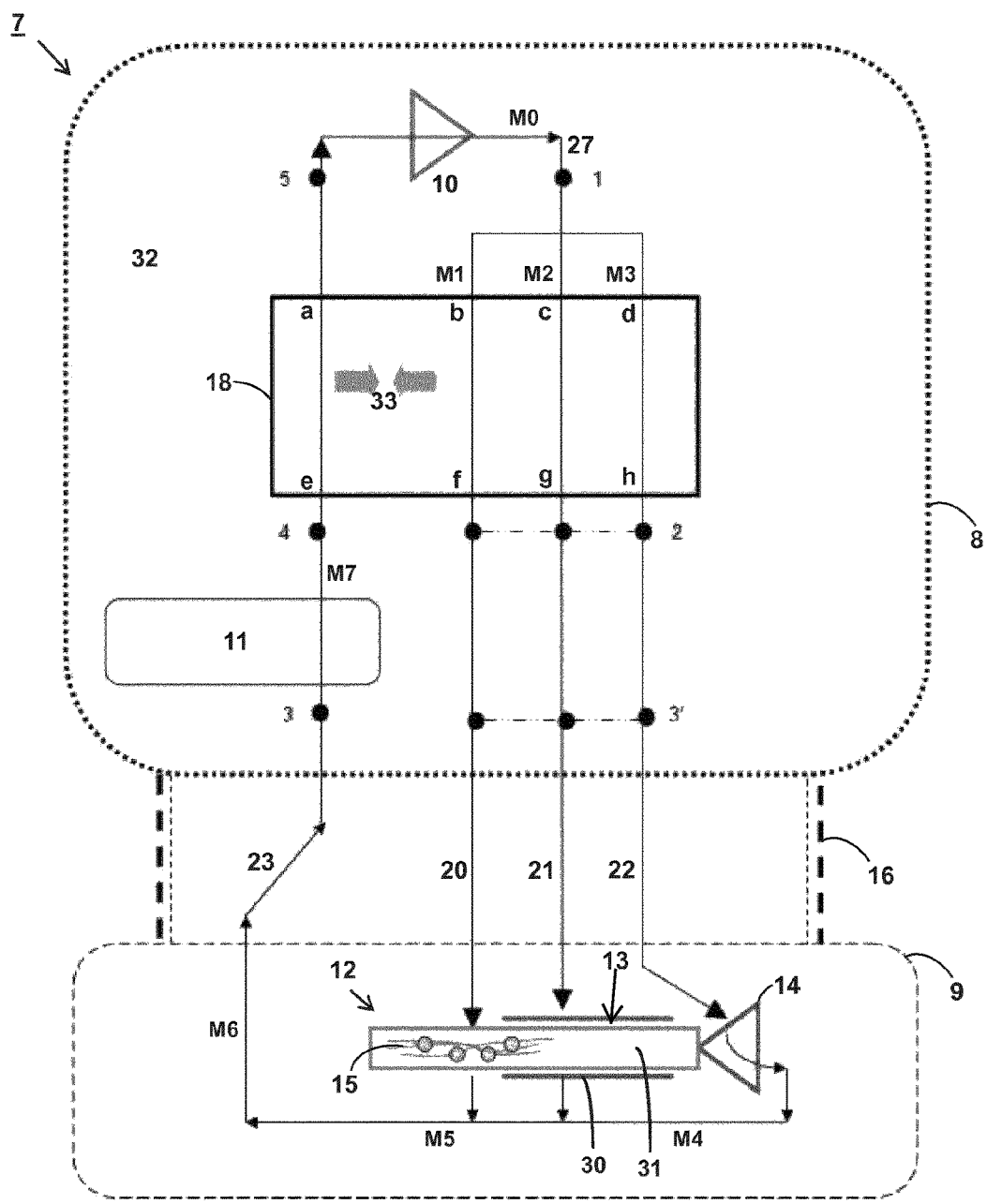
FIG. 2A describes an NMR analysis device according to a second embodiment of the invention.
Figure 2B:
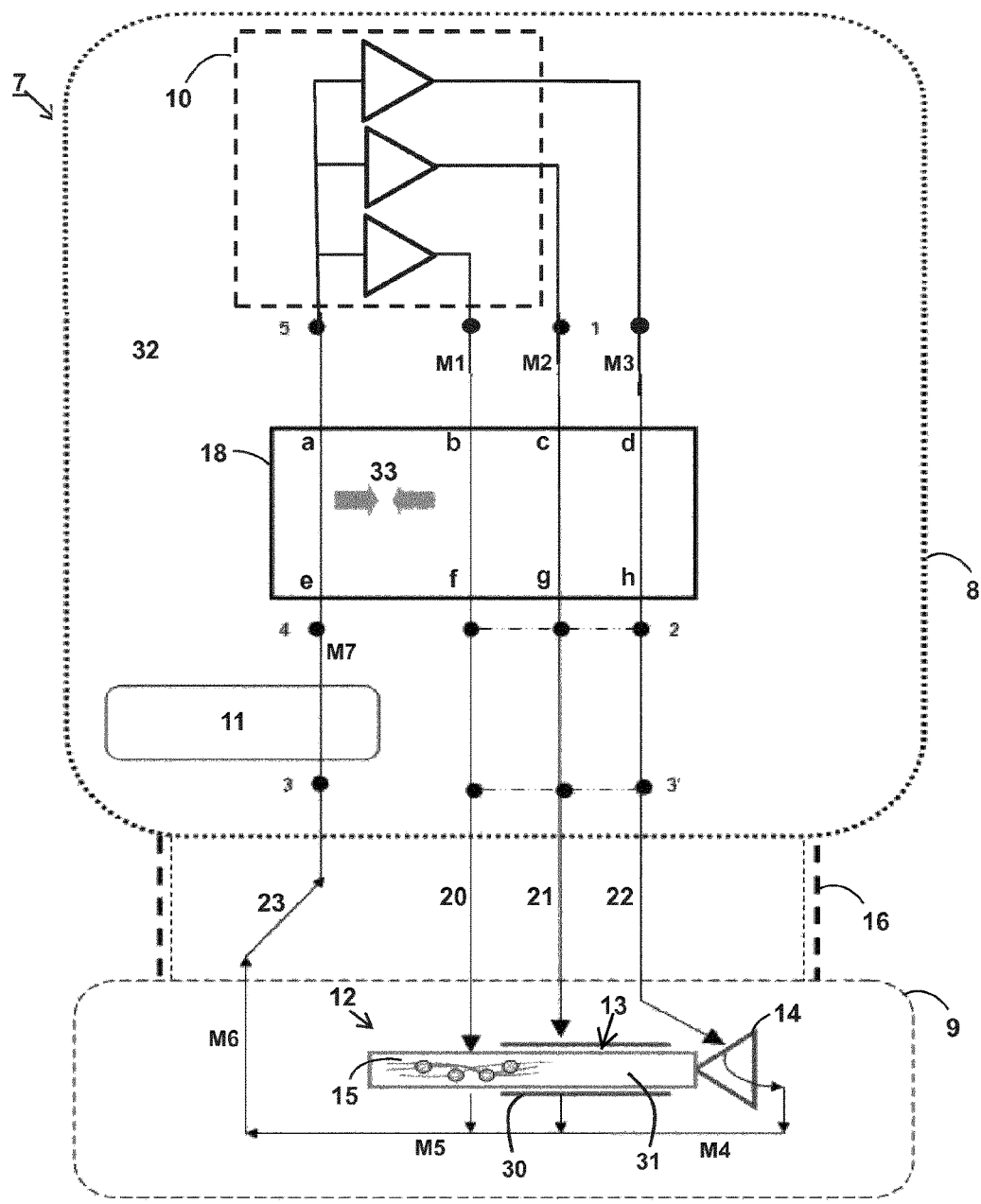
FIG. 2B describes a variant of the second embodiment of the invention.

In FIGS. 1 to 3, the device 7 comprises a cryostat 8 comprising the compression module 10 and at least one cryorefrigerator 11. The compression module 10 of the device 7 illustrated in FIGS. 1, 2A and 3 is a cold compressor whereas that of the device 7 represented in FIG. 2B corresponds to three cold compressors suitable for each respectively supplying one of the high-pressure (HP) gaseous flows M1, M2, M3.

Alternatively, this cryostat 8 can also additionally comprise the NMR analysis probe 9 or at least one heat exchanger, or even a combination of these two components.

In this configuration of the cryostat 8, the cold pressurized loop makes it possible to minimize the size of the heat exchanger and simplify the NMR analysis device 7 compared to the configuration of a loop comprising a hot compression module 10 outside the chamber 35 of the cryostat 8.

In this configuration, in which the components of the loop are mounted inside the vacuum chamber 35 of the cryostat 8, these components are all brought to a cryogenic temperature. Furthermore, in this configuration, the cryostat 8 does not comprise any inlet and outlet fluid passages, and there is no need to reheat the fluid circulating in this loop since it is not treated by a hot compression module 10 installed at ambient temperature outside of the cryostat 8.

Thus, the compression module 10 can correspond, in the device 7 illustrated in FIGS. 4 to 8, to a hot compressor, but it can, in variants, correspond, in the device 7 of these figures, to three hot compressors each respectively supplying one of the gaseous flows M1, M2, M3.

Similarly, the compression module 10 of the device 7 illustrated in FIG. 2B can be implemented in the device 7 of FIGS. 1 and 3.

In FIGS. 1 to 3, the cryorefrigerator 11, which is contained in the cryostat 8, can be arranged in various ways in the chamber 35 of this cryostat 8, for example:
- between the first and second exchangers 18, 19 included in this cryostat 8, by being arranged downstream of the second exchanger 19 and upstream of the first exchanger 18;
- between the probe 9 and the first exchanger 18, by being arranged downstream of the NMR analysis probe 9 and upstream of the first exchanger 18, the first exchanger 18 being notably included in the chamber 35 of the cryostat 8, or even
- between the probe 9 and the compression module 10, by being arranged downstream of the NMR analysis probe 9 and upstream of the compression module 10, the compression module 10 being notably included in the chamber 35 of the cryostat 8.

This cryorefrigerator 11 is configured for a fourth channelling element to be able to conduct a gaseous flow M6 in order to pass through it in such a way that the temperature of this flow is lowered to a predefined cryogenic temperature. The fluid used by the cryorefrigerator 11 is a low-pressure cryogenic fluid at low temperature which serves as refrigerant. This refrigerant can, for example, be nitrogen or helium.

In certain embodiments of the NMR analysis device 7 illustrated in FIGS. 2A to 8, the cryostat 8 can comprise at least one heat exchanger. In some of these embodiments illustrated in FIGS. 3 to 5 in which the components of the device 7 are configured to perform a Brayton thermodynamic cycle, the cryostat 8 comprises, for example, two heat exchangers 11 and 18 of counter-current tubular fluid/fluid type. Naturally, it is obvious that the heat exchangers included in the cryostat 8 can be in any other number and any type of heat exchanger other than those described.

Figure 13:
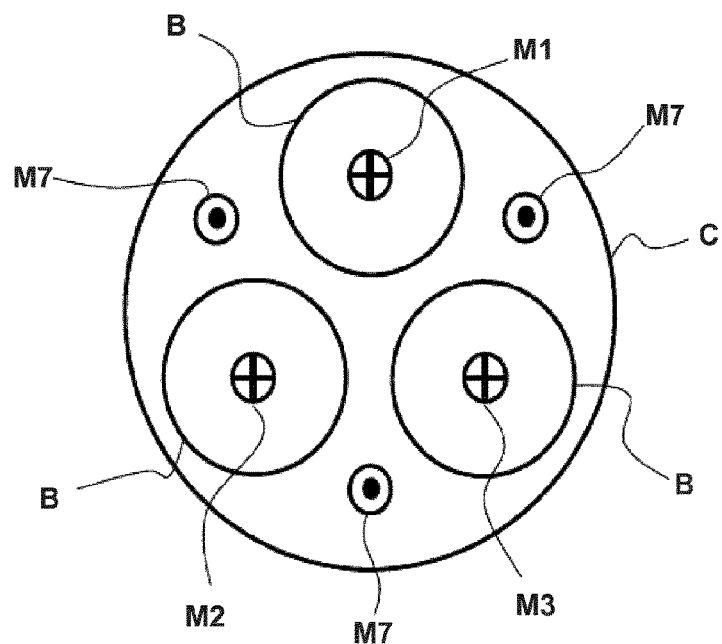
FIGS. 13 and 14 illustrate an exemplary exchanger that can be used in the different embodiments of the invention.
Figure 14:
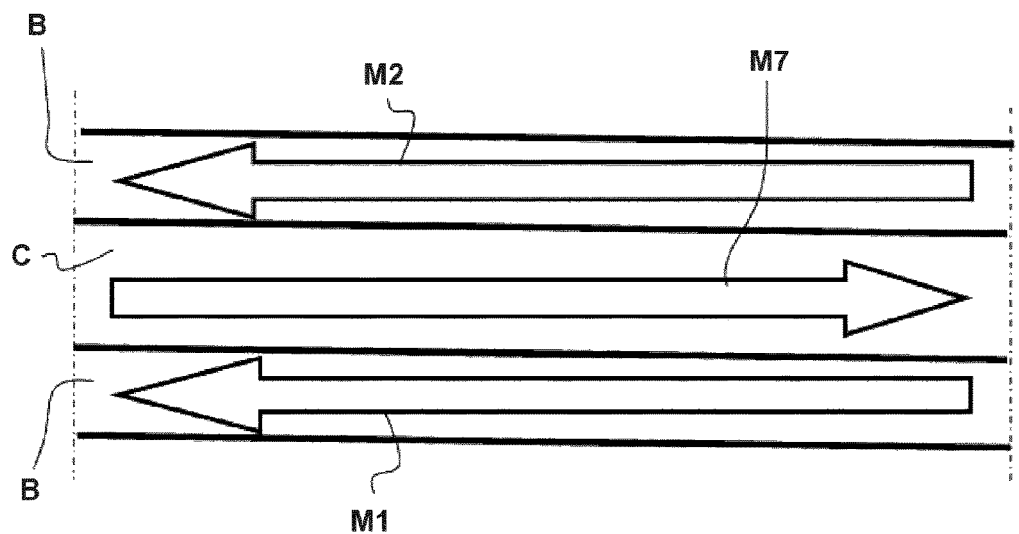

The first heat exchanger 18 is provided with four inlets e, b, c, d and four outlets a, f, g, h. Such a counter-current tubular fluid/fluid type exchanger 18 is represented in FIGS. 13 and 14. This heat exchanger 18 comprises three high-pressure tubes B for the circulation in a first direction of the three gaseous flows M1, M2, M3 of high-pressure fluid. These three tubes B are positioned inside a large low-pressure tube C in which a gaseous flow M7 of low-pressure fluid circulates, in a second, reverse direction.

In such a first exchanger 18, the heat transfer 33 between the two fluids is obtained by a forced convection between the high-pressure gaseous flows M1, M2, M3 and the wall of their respective high-pressure tubes B, then by conduction through this wall, before a new forced convection between the outer surface of this wall of the high-pressure tubes B and the fluid of the low-pressure gaseous flow M7.

The symmetrical distribution of the three high-pressure tubes B within the gaseous flow M7 guarantees the same outlet temperature for the three gaseous flows M1, M2, M3, all things being furthermore equal.

It will be noted that, when the NMR analysis device 7 comprises an exchanger such as a heat exchanger 18, the compression module 10 can then be arranged between the outlet a and the inlets b, c, d, and the connection elements of the NMR analysis probe 9 can then be arranged between the outlets f, g, h and the inlet e.

The second heat exchanger 19 is provided with three inlets u, v, w and three outlets x, y, z. The second heat exchanger 19 is structurally and functionally substantially similar to the first exchanger 18, except that it comprises only two high-pressure tubes for the circulation in a first direction of two gaseous flows M1, M2 of high-pressure fluid, instead of three.

The ends of the tubes, of the first heat exchanger 18, can be equipped with a bellows, to facilitate their connections, notably with the tubes of the second exchanger 19. These bellows further allow for an adaptation to the variations of the dimensions of the components of the device 7, such as the tubes, because of the significant temperature variations. The assembly is, furthermore, spiral-wound to reduce the overall bulk of the first exchanger 18.

It will be noted that, in the embodiments illustrated in FIGS. 4 to 8, in which the NMR analysis device 7 comprises a hot compression module 10, these embodiments comprise a third heat exchanger 17 arranged between this hot compression module 10 and the cryostat 8 to which it is linked, that is to say that this third exchanger 17 is positioned downstream of the compression module 10 and upstream of the cryostat 8.

The NMR analysis device 7 also comprises an NMR analysis probe 9 comprising a frame in which a mobile sample-holder 12 and a bearing for rotationally guiding said sample-holder 12 relative to the frame are arranged. The components of the probe, potentially brought to low temperatures, are supported or suspended mechanically by parts made of a thermally insulating material.

This sample-holder 12 is positioned in the NMR analysis probe 9 in an inclined manner with an angle that can be adjusted between axes which are parallel and at right angles to the static magnetic field.

This sample-holder 12 comprises a tube in which the sample of material 15 to be analysed is placed. This sample of material 15 can be a solid sample.

As illustrated by the figures, the sample-holder 12 then comprises a rotor 31 and a stator 30. This stator 30 can further comprise bearings 13.

The turbine 14 is provided with blades or fins which, when they are struck by a gaseous flow M3, rotate the rotor of the sample-holder 12. The turbine 14 uses the kinetic energy contained in the gaseous flow M3 to rotate the rotor of the sample-holder 12. Thus, the kinetic energy of the gaseous flow M3 is used to produce mechanical energy. A turbine can be arranged at the two ends of the rotor. The turbine 14 is mounted kinematically linked with the sample-holder 12 rotor.

The rotor can be a tube closed by two plugs, which fulfil two functions: on the one hand, the sealing of the tube and, on the other hand, the rotation of the sample-holder 12. Each plug comprises, for example, a turbine 14.

In other embodiments of the NMR analysis device 7 illustrated for example in FIGS. 3, 4 and 5, when its components are configured to perform a Brayton thermodynamic cycle, each of these plugs then corresponds to an expansion turbine kinematically linked with the rotor 31. This expansion turbine has the same features and properties as an expansion unit configured to be implemented in Brayton thermodynamic cycles.

In effect, this expansion turbine has a particular geometry which is such that the isentropic efficiency of the expansion of the fluid through the latter is greater than 70%, even greater than 85%.

Thus, the geometry of this turbine allows for an isentropic expansion of the gaseous fluid M3 which passes through it with an isentropic efficiency greater than 70%, even greater than 85%. Isentropic expansion should be considered to be an expansion in which the isentropic efficiency relative to a purely isentropic expansion is greater than 70%, even greater than 85%.

Furthermore, this particular geometry of the turbine makes it suitable for lowering the temperature of gaseous flows which pass through it for example by:

15 to 10 K by supplying a power of the order of 50 W and/or 70 to 55 K by supplying a power of the order of 150 W.

This particular geometry can be obtained by machining, from the mass of the plugs described previously, or blades or fins, the arrangement and the characteristics of which aim to provoke the expansion of isentropic type of the gaseous flow M3 of fluid which passes through them. Such an expansion then provokes a lowering of the temperature of this gaseous flow.

These blades or fins use the kinetic energy of the high-pressure gaseous fluid M3 to rotate the sample-holder 12. The energy of the high-pressure gaseous fluid which then passes through an expansion turbine is characterized by its velocity and by its enthalpy. On passing into the expansion turbine, the compressible fluid undergoes an expansion of isentropic type the efficiency of which depends on the constructional geometry of the blades of the expansion turbine. Thus, the energy contained in this fluid is treated by the expansion turbine to further cool the sample and/or to reduce the energy consumption of the device 7.

The fluid of the high-pressure gaseous flow M3 which passes into the expansion turbine therefore undergoes a real trend that departs from the ideal isentropic trend to a greater or lesser degree. The isentropic (adiabatic) efficiency of the expansion turbine is the expression of the difference between the two trends or even the ratio of the work recovered in the real trend to the work recovered in an isentropic trend.

By disregarding the variations of kinetic energy and of potential energy between the inlet and the outlet of the expansion turbine, itself assumed adiabatic, the isentropic efficiency is equal to the ratio of the corresponding enthalpies. The observed enthalpy variation is equivalent to a temperature variation of the gas. The higher the isentropic efficiency, the greater the lowering of temperature.

Figure 11:
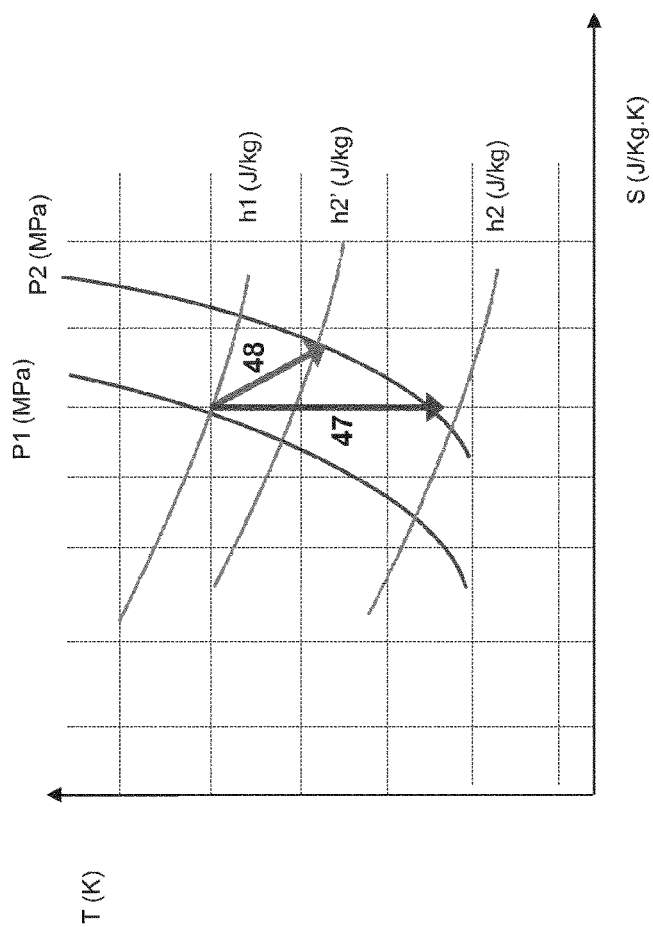
FIG. 11 represents a diagram relating to the isentropic efficiency.

The diagram of FIG. 11 illustrates this concept of efficiency which is also called quality factor. During an expansion by passing from a high pressure P1 to a low pressure P2, the arrow 47 indicates an ideal isentropic trend with a variation of enthalpy (h1 to h2) and a significant lowering of the temperature, whereas the arrow 48 shows what could be a real trend with a variation of enthalpy (h1 to h2') that is less significant and consequently a less substantial lowering of temperature.

The NMR analysis probe 9 is linked to the cryostat 8 by a cryogenic line 16 through which a variety of elements for channelling gaseous flows M1, M2, M3, M4, M5, M6, M7 of gaseous fluid M0 pass. These channelling elements have, for example, fluid supply lines relative to these gaseous flows M1, M2, M3, M4, M5, M6, M7. These channelling elements are produced from a metal material suited to cryogenics such as, for example, a so-called low-carbon austenitic stainless steel grade, or even copper.

It will be noted that the NMR analysis devices 7 do not include any cryogenic line 16 when the probe 9 is contained in the cryostat 8, as the embodiment of the device 7 of FIG. 6 illustrates.

In this NMR analysis device 7 illustrated in FIGS. 1 to 8, a channelling element 27, linked at one end to the compression module 10, is divided at its other end into three channelling elements 20, 21, 22. As will be seen hereinbelow in certain embodiments such as that illustrated in FIG. 2B, the device 7 does not include any channelling element 27 because the compression module corresponds to three compressors connected respectively to the first, second and third channelling elements 22, 21, 20.

The other channelling elements included in this NMR analysis device 7 are as follows:
A first element 22 for channelling the gaseous flow M3 of fluid to the turbine 14;
a second element 21 for channelling the gaseous flow M2 of fluid to the bearing 13;
a third element 20 for channelling the gaseous flow M1 of fluid to the sample-holder 12, and
a fourth element 23 for channelling the gaseous flow M6 of fluid downstream of the rotor 31 and stator 30 of the sample-holder 12, to the compression module 10, passing through the components of the cryostat 8.

In the embodiments of the NMR analysis device 7 illustrated in FIGS. 3, 4 and 5, when its components are configured to perform a Brayton thermodynamic cycle:
the first element 22 for channelling the gaseous flow M3 conveys this flow of fluid to a turbine 14;
the fourth channelling element can be replaced by an element 24 for channelling the gaseous flow M4 of fluid downstream of the rotor 31 of the sample-holder 12, to the compression module 10, passing through the components of the cryostat 8, and
a fifth channelling element 25 is arranged in this device 7, to convey the gaseous flow M5 of fluid recovered downstream of the stator 30 of the sample-holder 12, to the fourth channelling element 24. It is able to conduct the gaseous flow M5 in the circuit of this device 7 at the level of the fourth channelling element 24 between the cryorefrigerator 11 and the second exchanger 19, that is to say downstream of the second exchanger 19 and upstream of the cryorefrigerator 11.

In other embodiments illustrated in FIGS. 6 to 8, in which valves and/or redirection elements are arranged on some of these channelling elements, this device 7 comprises other channelling elements:
a sixth element 26 for channelling the gaseous flow M9;
a seventh channelling element 29 which is able to establish a link between the channelling elements 20, 21, 22 and the fourth channelling element 23, and
an eighth element 28 for channelling the gaseous flow M8 which is able to conduct this gaseous flow M8 in the circuit of this device 7 at the level of the fourth channelling element 23 between the first heat exchanger 18 and the cryorefrigerator 11, that is to say downstream of the cryorefrigerator 11 and upstream of the first exchanger 18.

These channelling elements form the circuit of this NMR analysis device 7. This circuit relates notably, depending on the embodiment, to the channelling elements 20, 21, 22, 23, 27, for the device 7 represented in FIGS. 1, 2A and 5 to 8 or to the channelling elements 20, 21, 22, 24, 25, 27, for the devices 7 illustrated in FIGS. 3 and 4, or even to the channelling elements 20, 21, 22, 23, for the device 7 represented in FIG. 2B.

It will be noted that the channelling elements 27, 20, 21, 22 situated downstream of the compression module 10 and upstream of the sample-holder 12 relate to the high-pressure part of the circuit, whereas the channelling elements 24, 25 or the element 23 situated downstream of the sample-holder 12 and upstream of the compression module 10 correspond to the low-pressure part of the circuit.

In these embodiments, the fourth channelling element 23 for the device 7 represented in FIGS. 1, 2A, 2B and 5 to 8 (or 24 for the devices 7 illustrated in FIGS. 3 and 4) passes through the cryorefrigerator 11 and the first exchanger 18 at the inlet e and the outlet a. In addition, it will be noted that the first, second and third channelling elements 20, 21, 22 respectively pass through the first exchanger 18 at the inlets b, c, d and outlets f, g, h.

It will be noted that, in the embodiments of the NMR analysis device 7 illustrated in FIGS. 3, 4 and 5, when its components are configured to perform a Brayton thermodynamic cycle, the first and second channelling elements 21, 22 pass respectively through the first exchanger 18 at the inlets b, c and outlets f, g, and the second exchanger 19 at the inlets v, w and outlets y, z, the third channelling element 23 passing through the first exchanger 18 at the inlet d and the outlet f. Furthermore, in these embodiments, when the low-pressure gaseous flow M6 is formed by the low-pressure gaseous flow M4 and the low-pressure gaseous flow M5, the channelling element 23 passes through the cryorefrigerator 11 and the first exchanger 18 at the inlet e and the outlet a, and notably the second exchanger 19 at the inlet x and the outlet u.

FIGS. 1 to 3 represent embodiments of the NMR analysis device 7 in which said device 7 comprises a cryostat 8 linked by a cryogenic line 16 to an NMR analysis probe 9. The cryostat 8 comprises a cold compression module 10 and, in certain embodiments, a cryorefrigerator 11 and/or at least one exchanger 19, 18.

As has been seen previously, the gaseous flow M0 will undergo a compression from the compression module 10. At the outlet of this compression module 10 at the point 1 of FIGS. 1, 2A, 2B and 3, this gaseous fluid M0 is then a high-pressure (HP) gaseous fluid M0. During this compression, the temperature of this high-pressure gaseous fluid M0 has increased since the outside medium has supplied work to the system which increases its internal energy and therefore its thermal agitation.

In a first embodiment of the NMR analysis device 7 illustrated in FIG. 1, this device 7 comprises a cryostat 8 linked to a probe 9 by a cryogenic link 16. The cryostat 8 comprises a cold compression module 10 and a cryorefrigerator 11. The probe 9 comprises a sample-holder 12. The cryorefrigerator 11 is arranged between the cold compression module 10 and the sample-holder 12, downstream of the sample-holder 12 and upstream of the cold compression module 10.

In this embodiment, this high-pressure gaseous fluid M0 has a temperature at the point 1 which lies between 10 and 14 K. This high-pressure gaseous fluid M0 is divided into three flows M1, M2, M3 of high-pressure gaseous fluid M0 after having passed through the compression module 10. Each of the high-pressure gaseous flows M1, M2, M3 is respectively conducted, to the chamber 35 close to the outlet of the cryostat 8 from the point 1 to the point 3', by the channelling elements 20, 21, 22. At the point 3', the temperature of these high-pressure gaseous flows M1, M2, M3 still lies between 10 and 14 K.

At the outlet of the cryostat 8, these high-pressure gaseous flows M1, M2, M3 are conducted to the NMR analysis probe 9, and more particularly to the sample-holder 12.

In effect, each of these high-pressure fluid gaseous flows M1, M2, M3 is intended respectively for the cooling of the sample, the supporting or the guiding of the sample and the rotating of the sample. More specifically, the function of the first gaseous flow M1 of fluid is to bring the sample-holder 12 and/or the sample to a certain temperature. The function of the second flow M2 is to create an aerostatic or aerodynamic bearing 13 for supporting or guiding the rotor 31 in the stator 30, and the function of the third flow M3 is to rotate this sample-holder 12, by acting on the blades or fins of the turbine driving a rotor 31 which comprises the sample-holder 12.

In the probe 9, low-pressure gaseous flows M4 and M5 are recovered at the level of the rotor 31 and stator 30 of the sample-holder 12 so as to form just one low-pressure gaseous flow M6. This low-pressure gaseous flow M6 is conducted to the cryostat 8 by the fourth channelling element 23. The gaseous flow M5 recovered at the outlet of the stator 30 of the sample-holder corresponds to the flows resulting from the high-pressure gaseous flows M1, M2 having respectively brought the sample and/or the sample-holder to a certain temperature and created an aerostatic or aerodynamic bearing 13 for supporting or guiding the rotor 31 in the stator 30.

This low-pressure gaseous flow M6, on entering into the cryostat 8, has a temperature, at the point 3, lying between 13 and 17 K. This low-pressure gaseous flow M7 then passes through the cryorefrigerator 11 before reaching the compression module 10.

At the outlet of this cryorefrigerator 11, at the point 4, the low-pressure gaseous flow M7, which relates to the gaseous flow resulting from the gaseous flow M6 passing through this cryorefrigerator 11, has reached a very low temperature lying between 8 and 12 K. The temperature of this low-pressure gaseous flow M7 is lower than that of the high-pressure gaseous flows M1, M2, M3.

The low-pressure gaseous flow M7 then passes through the compression module 10 from which it emerges in the form of a high-pressure gaseous fluid M0.

In a second embodiment of the NMR analysis device 7 illustrated in FIG. 2A, this device 7 is substantially similar to that of the first embodiment. In effect, this device 7 comprises an additional component compared to this first embodiment which is arranged in the cryostat 8 chamber 35. This component corresponds to a heat exchanger 18 positioned between the cryorefrigerator 11 and the compression module 10, here a cold compressor, so as to be situated downstream of the cryorefrigerator 11 and upstream of the cold compression module 10.

In this embodiment, the high-pressure gaseous fluid M0 has a temperature at the point 1 which lies between 28 and 32 K. This high-pressure gaseous fluid M0 is divided into three flows M1, M2, M3 of high-pressure gaseous fluid M0 after having passed through the cold compression module 10. Each of these high-pressure gaseous flows M1, M2, M3 enters into the heat exchanger 18 respectively at the inlets b, c, d.

This heat exchanger 18 is, for example, an exchanger of counter-current tubular fluid/fluid type described in FIGS. 13 and 14.

This exchanger 18 comprises three high-pressure tubes B for the circulation in a first direction of the three gaseous flows M1, M2, M3 of high-pressure fluid. These three tubes B are positioned inside a large low-pressure tube C in which the low-pressure gaseous flow M7 of low-pressure fluid circulates, in a second, reverse direction. This low-pressure gaseous flow M7, circulating in the reverse direction of the gaseous flows M1, M2, M3 of high-pressure fluid, corresponds to the gaseous flow resulting from the low-pressure gaseous flow M6 passing through the cryorefrigerator 11. In passing through the cryorefrigerator 11, the flow M7 reaches very low temperatures.

At the outlet of the cryorefrigerator 11 at the point 4 and before entering into the exchanger 18 through the inlet e, the temperature of the low-pressure gaseous flow M7 lies between 13 and 17 K. In fact, the low-pressure gaseous flow M7 then has a temperature much lower than those of the gaseous flows M1, M2, M3 entering through the inlets b, c, d of the exchanger 18.

In this exchanger 18, from the point 1 to the point 2, a heat transfer 33 is produced between the two fluids, that of the low-pressure gaseous flow M7 and of the high-pressure gaseous flows M1, M2, M3. This heat transfer 33 induces a cooling of the high-pressure gaseous flows M1, M2, M3. The symmetrical distribution of the three high-pressure tubes within the gaseous flow M7 guarantees the same outlet temperature for the three gaseous flows M1, M2, M3. Thus, this lowered temperature of the high-pressure gaseous flows M1, M2, M3 lies, at the outlet of this heat exchanger 18, at the point 2, between 16 and 20 K.

As for the low-pressure gaseous flow M7, its temperature after having passed through the exchanger 18 has increased to lie, at the point 5, between 25 and 29 K. In effect, as has been seen previously, in heat transfer 33 between this low-pressure gaseous flow M7 and the high-pressure gaseous flows M1, M2, M3, the latter have transferred heat.

Thus, the three cooled high-pressure gaseous flows M1, M2, M3 then leave the exchanger 18 through the outlets f, g, h to be conducted by the channelling elements 20, 21, 22, by passing through the cryostat 8, to the NMR analysis probe 9, to reach the sample-holder 12.

Then, this low-pressure gaseous flow M7 passes through the compression module 10 from which there results, at the outlet, a high-pressure gaseous fluid M0.

In the variant of this second embodiment of the NMR analysis device 7 illustrated in FIG. 2B, this device 7 is substantially similar to that of this second embodiment. In effect, in this device 7, the compression module 10 corresponds to three cold compressors each capable of supplying one of the gaseous flows M1, M2, M3 to the heat exchanger 18. In this variant, the gaseous fluid travels through the circuit of this NMR analysis device 7 according to the same process implemented for the second embodiment.

In a third embodiment of the NMR analysis device 7, illustrated in FIG. 3, this device 7 differs from that of the second embodiment in that it comprises the second heat exchanger 19. This second exchanger 19 is arranged in the cryostat 8, between the probe 9 and the cryorefrigerator 11. In this embodiment, the components of this device 7 are configured to perform a Brayton thermodynamic cycle.

In this embodiment, the high-pressure gaseous fluid M0 has a temperature at the point 1, at the outlet of the compression module 10, which lies between 28 and 32 K. This high-pressure gaseous fluid M0 is divided into three flows M1, M2, M3 of high-pressure gaseous fluid M0 after having passed through the compression module 10.

Figure 9:
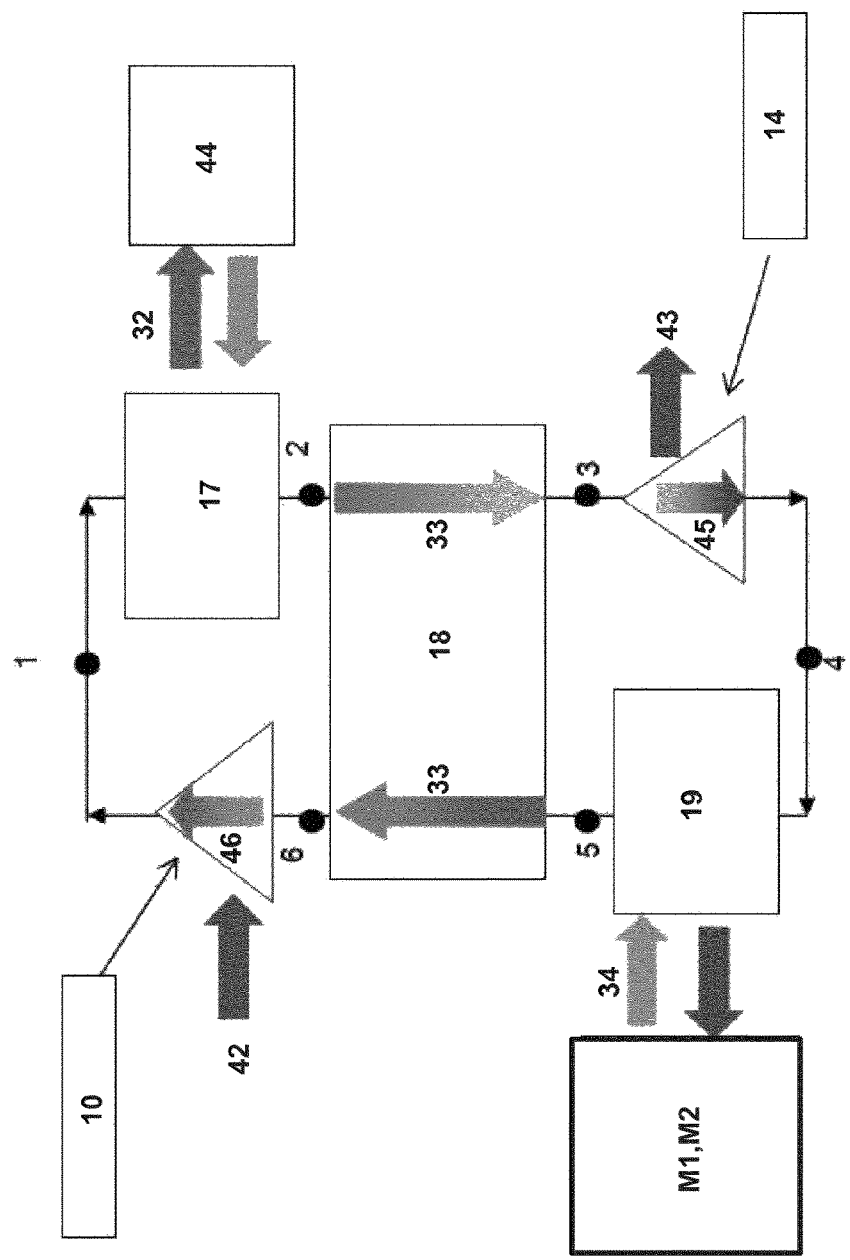
FIG. 9 represents a functional diagram of the method of an NMR analysis device.
Figure 10:
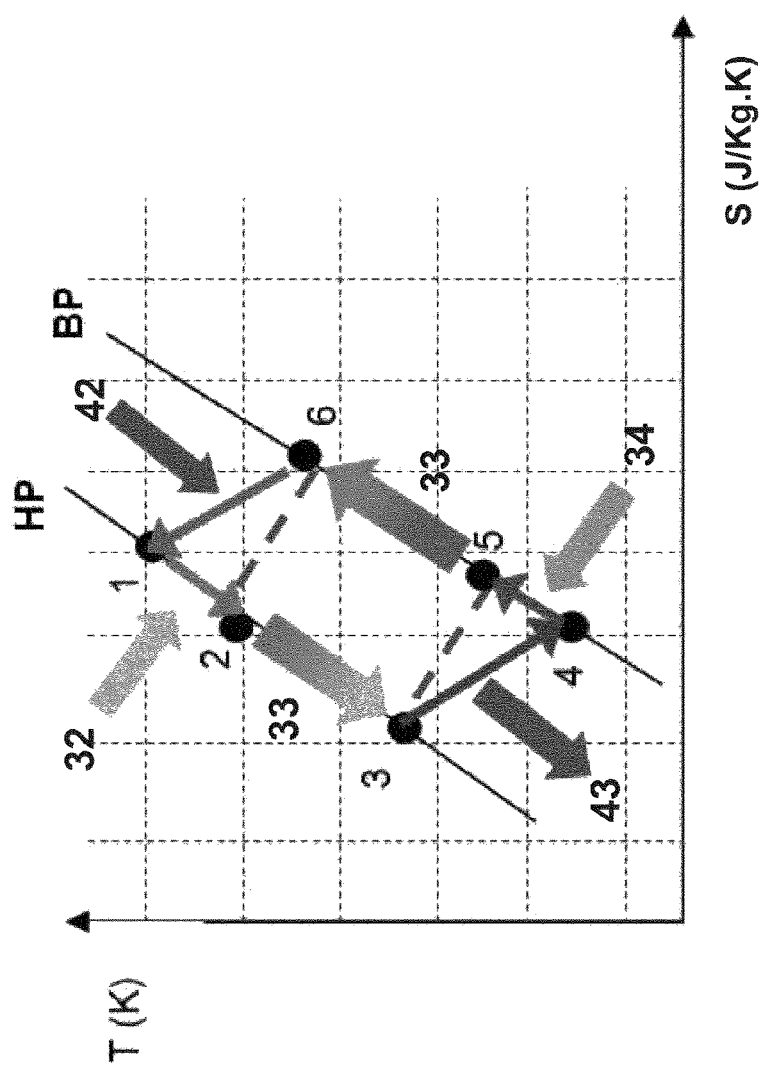
FIG. 10 is a thermodynamic diagram representing the thermodynamic cycle implemented in an NMR analysis device.

From the point 2 to the point 3 of FIGS. 3, 9 and 10, each of these high-pressure gaseous flows M1, M2, M3 passes through the heat exchanger 18 according to the same process implemented in the second embodiment of the device 7 represented in FIG. 2A.

Thus, these high-pressure gaseous flows M1, M2, M3 reach, at the outlets f, g, h of this exchanger 18, that is to say at the point 3, temperatures lying between 23 and 27 K. In effect, in the heat transfer 33 produced between the points 2 and 3, in this exchanger 18, between the two fluids, that of the low-pressure gaseous flow M7 and of the high-pressure gaseous flows M1, M2, M3, the temperature thereof is lowered. By contrast, in this heat transfer 33 produced between the points 5 and 6, that of the gaseous flow M7 has increased to lie between 25 and 29 K, at the outlet a of this exchanger 18, at the point 6.

On exiting from the second exchanger 18, the high-pressure gaseous flows M1, M2 are conducted to the second exchanger 19 by the second and third channelling elements 20, 21, whereas the high-pressure gaseous flow M3 is conducted to the turbine 14, by the first channelling element 22 and, more particularly, to the blades or fins of one or more expansion turbines of the sample-holder 12.

This second exchanger 19 is also of the counter-current tubular fluid/fluid type, like the first exchanger 18. In this second exchanger 19, from the point 3 to the point 4', a heat transfer 34 is produced between the two fluids, that of the low-pressure gaseous flow M4 and of the high-pressure gaseous flows M1, M2. This heat transfer 34 induces a cooling of the high-pressure gaseous flows M1, M2, the lowered temperature of which, at the point 4' at the outlet y, z of this second exchanger 19, lies between 13 and 17 K. These two cooled high-pressure gaseous flows M1, M2 then leave the cryostat 8 to be conducted by the channelling elements 20, 21 to the NMR analysis probe 9 to reach the sample-holder 12.

Regarding the low-pressure gaseous flow M4, in the heat transfer 34 from the point 4 to the point 5 of FIGS. 3, 9 and 10, its temperature has increased after having passed through the second exchanger 19. This temperature lies, at the point 5, between 20 and 24 K. In effect, in the heat transfer 34 between this low-pressure gaseous flow M4 and the high-pressure gaseous flows M1, M2, the latter have transferred heat. It will be noted that the temperature at the point 4 corresponds to that of the gaseous flow M4 resulting from the turbine 14.

In this embodiment, the low-pressure gaseous flow M4 results from the passage into the turbine 14 of the gaseous flow M3 which is then conducted to the inlet x of the second exchanger 19 by the fourth channelling element 24, at the point 4.

The low-pressure gaseous flow M4 then has a lower temperature than the high-pressure gaseous flow M3, which is obtained by the expansion of the high-pressure gaseous flow M3 fluid in the expansion turbine. This expansion of the fluid of the gaseous flow M3 is illustrated in FIGS. 9 and 10 from the point 3 to the point 4. In this expansion, the temperature of the gaseous flow M3 has decreased because the system has provided work to the outside medium as illustrated by the arrow 43 in FIGS. 9 and 10.

For its part, the low-pressure gaseous flow M5 is recovered at the outlet of the stator 30 of the sample-holder 12, and corresponds to the flows resulting from the gaseous flows M1, M2 having respectively brought the sample to a certain temperature and created an aerostatic or aerodynamic bearing 13 for supporting or guiding the rotor 31 in the stator 30. This low-pressure gaseous flow M5 is injected, by the fifth channelling element 25, between the second exchanger 19 and the cryorefrigerator 11 included in the cryostat 8, that is to say at the point 5. This low-pressure gaseous flow M5 combined with the flow resulting from the passage of the low-pressure gaseous flow M4 into the second exchanger 19 then constitutes the low-pressure gaseous flow M6.

This low-pressure gaseous flow M6 passes through the cryorefrigerator 11. The flow resulting from this passage corresponds to the gaseous flow M7 which has a lower temperature than that of the gaseous flow M6. This low-pressure gaseous flow M7 enters into the first exchanger 18, in which the high-pressure gaseous flows M1, M2, M3 transfer heat to said low-pressure gaseous flow M7, according to the process explained previously.

Subsequently, the low-pressure gaseous flow M7, from the point 6 to the point 1, passes through the cold compression module 10 from which there results a high-pressure gaseous fluid M0 at the outlet.

In a fourth embodiment of the NMR analysis device 7 illustrated in FIG. 4, the components thereof are, in a manner substantially similar to the third embodiment, configured to perform a Brayton thermodynamic cycle. The device 7 differs from that of the third embodiment in that it comprises a hot compression module 10, and not a cold compression module 10. This hot compression module 10 is arranged outside the chamber 35 of the cryostat 8 and linked to the third heat exchanger 17, also situated outside of this cryostat 8.

In this embodiment, the gaseous fluid M0 will undergo a compression from the compression module 10, from the point 6 to the point 1 of FIGS. 4, 9 and 10. At the outlet of this compression module 10, this gaseous fluid M0 is then a high-pressure (HP) gaseous fluid M0. In this compression, the temperature of this high-pressure gaseous fluid M0 has increased since the outside medium has supplied work to the system which causes its internal energy, and therefore its thermal agitation, to increase, as illustrated by the arrow 42 in FIGS. 9 and 10. Consequently, at the outlet of the compression module 10, this temperature lies between 330 and 370 K.

This high-pressure gaseous fluid M0 then passes through the third heat exchanger 17 situated outside of the cryostat 8, from the point 1 to the point 2 in FIGS. 4, 9 and 10. In this third heat exchanger 17, a heat transfer is produced between this high-pressure gaseous fluid M0 and the immediate environment 44 in which the NMR analysis device 7 is located. Its temperature is then lowered substantially to the level of the ambient temperature relative to this environment, or to the vicinity of such a temperature. This high-pressure gaseous fluid M0 has therefore transferred heat in a heat transfer 32 in this third exchanger 17 with the environment 44. At the outlet of this third exchanger 17, the lowered temperature of the high-pressure gaseous fluid M0 lies between 280 and 320 K.

At the outlet of this third exchanger 17, the high-pressure gaseous fluid M0 is divided into three gaseous flows M1, M2, M3 of high-pressure fluid. Each of these high-pressure gaseous flows M1, M2, M3 then passes through the cryostat 8 and the probe 9 according to the same process implemented in the third embodiment of the NMR analysis device 7.

In this fourth embodiment, the temperatures at the different stages of progress of the gaseous fluid M0 in the device 7 are as follows:
  at the outlets f, g, h of the first heat exchanger 18, at the point 3, the lowered temperature of the high-pressure gaseous flows M1, M2, M3 lies between 23 and 27 K;
  at the outlet a of the first exchanger 18, at the point 6, the low-pressure gaseous flow M7 has a temperature which has increased to lie between 277 and 317 K;
  at the outlet u of the second exchanger 19, the low-pressure gaseous flow M6 has a temperature lying between 20 and 24 K;
  at the outlets y, z of the second heat exchanger 19, the lowered temperature of the high-pressure gaseous flows M1, M2 lies between 13 and 17 K, and
  at the inlet x of the second exchanger 19, the low-pressure gaseous flow M4 has a temperature lying between 10 and 14 K.

In a fifth embodiment of the NMR analysis device 7 illustrated in FIG. 5, this device 7 is substantially similar to that of the fourth embodiment. However, it differs from this fourth embodiment in that it comprises a fourth element 23 for channelling the gaseous flow M6 of fluid recovered downstream of the rotor 31 and stator 30 of the sample-holder 12 capable of conveying the gaseous flow M6 to the second exchanger 19. In effect, in the fourth embodiment, the fourth channelling element 24 conducted a gaseous flow M4 recovered downstream of the rotor 31 of the sample-holder 12, to the second exchanger 19.

Furthermore, in this embodiment, this low-pressure gaseous flow M6 is formed by the low-pressure gaseous flow M4 and the low-pressure gaseous flow M5, unlike the gaseous flow M6 defined in the fourth embodiment which is formed by the gaseous flow M5 and the gaseous flow resulting from the passage of the gaseous flow M4 into the second exchanger 19.

In this fifth embodiment, the gaseous fluid M0 travels through the circuit of this NMR analysis device 7 according to the same process implemented for the fourth embodiment.

It will be noted that, in this device 7, the temperatures at the different stages of progress of the gaseous fluid M0 are substantially similar to those of the fourth embodiment, except that the gaseous flow M6, at the inlet x of the second heat exchanger 19, at the point 5, which lies between 11 and 15 K.

It is noted that this temperature at the inlet x of the second heat exchanger 19 is generally greater than that obtained at this same inlet x of the second exchanger 19 in the fourth embodiment. It does however remain sufficient to allow a counter-current heat exchange in the second exchanger 19.

In other embodiments represented in FIGS. 6 to 8, the NMR analysis device 7 comprises components such as valves and/or redirection elements which are arranged on certain channelling elements.

In these embodiments, the NMR analysis device 7 is suited to operate according to different configurations defined by the activation of the valves and/or redirection elements. Thus, the valves can therefore alternate between an open mode and a closed mode and the redirection elements can switch from an activated state to a deactivated state and vice versa.

In a sixth embodiment of the NMR analysis device 7 illustrated in FIG. 6, a hot compression module 10 is arranged outside the chamber 35 of the cryostat 8. In this embodiment, the third heat exchanger 17, also situated outside of this cryostat 8, is linked both to this hot compression module 10 and to a high-pressure fluid storage unit 41 which is also linked to the cryostat 8.

This cryostat 8, in addition to comprising, as in the second embodiment, the first heat exchanger 18 and a cryorefrigerator 11, comprises the NMR analysis probe 9 in its chamber 35.

This device 7 also comprises an external cryogenic fluid source 40 which is linked to the circuit between the first exchanger 18 and the cryorefrigerator 11.

In this sixth embodiment, the NMR analysis device 7 comprises six valves A1, A2, A3, A4, A5, A6:
  the looping element A1 is mounted on the fourth channelling element 23 downstream of the first exchanger 18 outside the cryostat 8 and upstream of the looping element A5. It makes it possible to control the discharge of the gaseous flow M7 to the outside environment downstream of the first exchanger 18;
  the looping element A2 is mounted on the eighth channelling element 28. It makes it possible to control the introduction of the gaseous flow M8 of cryogenic fluid at the level of the eighth channelling element 23 upstream of the first exchanger 18 and downstream of the cryorefrigerator 11;
  the looping element A3 is mounted on the seventh channelling element 26. It makes it possible to control the access of the gaseous flow M6 to this seventh channelling element 26;
  the looping element A4 is mounted on the channelling element 27 downstream of the third heat exchanger 17 and upstream of the high-pressure fluid storage unit 41. It makes it possible to control the access of the high-pressure gaseous fluid M0 to this storage unit 41;
  the looping element A5 is mounted on the fourth channelling element 23 downstream of the looping element A1 and upstream of the hot compression module 10. It makes it possible to control the access of the low-pressure gaseous flow M7 to the compression module 10, and
  the looping element A6 is mounted on the fourth channelling element 23 downstream of the sample-holder 12 and upstream of the cryorefrigerator 11.

In a seventh embodiment of the device 7 illustrated in FIG. 7, unlike the sixth embodiment, the NMR analysis probe 9 is included outside the cryostat 8 and the seventh channelling element 26 is linked to the fourth channelling element 23 outside the cryostat 8.

In this embodiment, the NMR analysis device 7 comprises two additional valves A7, A8 compared to the device 7 of the sixth embodiment. The looping element A7 is mounted on the seventh channelling element 26 downstream of the looping element A3 and upstream of the hot compression module 10. The looping element A7 makes it possible to control the access of the gaseous flow M9 to the hot compression module 10.

As for the looping element A8, the latter is also mounted on the seventh channelling element 26 downstream of the looping element A3 and upstream of the looping element A7. This looping element A8 makes it possible to control the discharge of the gaseous flow M9 to the outside environment 44.

In an eighth embodiment of the NMR analysis device 7 illustrated in FIG. 8, the device 7 is similar to that of the seventh embodiment. However, in the present embodiment, the device 7 comprises redirection elements VC1, VC2, VC3, VC4.

These redirection elements VC1, VC2, VC3, VC4 can switch from an activated state to a deactivated state and vice versa.

The redirection elements VC1, VC2, VC3 are respectively mounted on the channelling elements 22, 21, 20. These redirection elements VC1, VC2, VC3 are arranged downstream of the first exchanger 18 and respectively upstream of the valves A9, A10, A11.

They make it possible to control the redirection of the gaseous flows M3, M2, M1 to the probe 9 or to the seventh channelling element 29.

The redirection element VC4 is mounted on the fourth channelling element 23 and is arranged downstream of the cryorefrigerator 11 and upstream of the first exchanger 18. This redirection element VC4 makes it possible to control the access of the gaseous flow originating from the seventh channelling element 29, at the level of the fourth channelling element 23 between the cryorefrigerator 11 and the first exchanger 18.

In this embodiment, the NMR analysis device 7 comprises three additional valves A9, A10, A11 compared to the device 7 of the seventh embodiment. The looping element A11 is mounted on the third channelling element 20 downstream of the first exchanger 18 and upstream of the NMR analysis probe 9 and makes it possible to control the access of the gaseous flow M1 to said probe 9.

Concerning the looping element A10, it is mounted on the second channelling element 21 downstream of the first exchanger 18 and upstream of the NMR analysis probe 9 and makes it possible to control the access of the gaseous flow M2 to said probe 9.

Regarding the looping element A9, it is mounted on the first channelling element 22 downstream of the first exchanger 18 and upstream of the NMR analysis probe 9 and makes it possible to control the access of the gaseous flow M3 to said probe 9.

As has been seen, in these embodiments represented in FIGS. 6 to 8, the NMR analysis device 7 is suitable for operating according to different configurations defined by the activation of the valves and/or redirection elements. In effect, the valves can alternate between an open mode and a closed mode and the redirection elements can switch from an activated state to a deactivated state and vice versa. These configurations correspond to different modes of operation of these embodiments of the device 7.

In the sixth embodiment illustrated in FIG. 6, the NMR analysis device 7 comprises six valves from which, and in a non-exhaustive manner, three modes of operation, depending on the configuration given to these valves A1, A2, A3, A4, A5, A6, can be defined.

In the seventh embodiment of the device 7 represented in FIG. 7, this device 7 comprises eight valves A1, A2, A3, A4, A5, A6, A7, A8, whereas, in the eighth embodiment, it comprises eleven valves A1, A2, A3, A4, A5, A6, A7, A8, A1, A10, A11. Furthermore, as has been seen previously, in this eighth embodiment, the device 7 comprises four redirection elements VC1 to VC4.

In the seventh and eighth embodiments, the different configurations, defining the mode of activation of these valves and of the redirection elements, make it possible to implement an operating method for an NMR analysis device comprising steps for implementing at least five modes of operation of the NMR analysis device 7. The number of operating modes described for each of the embodiments of the device 7 is, of course, not exhaustive.

It will be noted, in a nonlimiting manner, that, for the first to the fourth modes of operation implemented notably in the eighth embodiment, the valves A9, A10, A11 are in open mode and the redirection elements VC1 to VC4 are not activated.

In the first mode of operation, the valves A1, A2, A3, A7 are configured in closed mode and the other valves are in open mode. Consequently, such a configuration of the valves then means that:

the gaseous flow M8 of cryogenic fluid emanating from the cryogenic fluid source 40 cannot enter into the circuit of this NMR analysis device 7 via the looping element A2;

the gaseous flow M7 originating from the first exchanger 18 cannot be discharged from the circuit to the outside environment 44 via the looping element A1, and the low-pressure gaseous flow M6 resulting from the low-pressure gaseous flows M4, M5 cannot access the sixth channelling element 26 via the looping element A3.

Thus, since the valves A1, A2 and A3 are closed, the NMR analysis device 7 is in a configuration in which the circuit corresponds to a single closed and pressurized loop. The refrigeration and the motorization of the sample-holder 12 are produced by this single loop.

In this mode of operation, the gaseous fluid M0 will undergo a compression from the compression module 10. At the outlet of this compression module 10, at the point 1 of FIGS. 6 to 8, this gaseous fluid is then a high-pressure gaseous fluid. In this compression, the temperature of this high-pressure gaseous fluid M0 has increased because the outside environment has supplied work to the system, which causes its internal energy and therefore its thermal agitation to increase. At the point 1, this temperature lies between 330 and 370 K. This compression module 10 notably makes it possible to define the flow rate of the gaseous fluid in this circuit.

This high-pressure gaseous fluid then passes through the third heat exchanger 17 from the point 1 to the point 2. In this third heat exchanger 17, a heat transfer 32 is produced between this high-pressure gaseous fluid M0 and the immediate environment 44 in which the NMR analysis device 7 is located. Its temperature is then lowered substantially to the level of the ambient temperature of this environment 44, or to the vicinity of such a temperature.

This high-pressure gaseous fluid has therefore transferred heat in a heat transfer 32 in this third exchanger 17 with the outside environment 44 of the device 7.

At the outlet of this third exchanger 17, point 2, the lowered temperature of the high-pressure gaseous fluid M0 lies between 280 and 320 K.

The high-pressure gaseous fluid M0 is then subsequently conducted to the high-pressure gaseous fluid M0 storage unit 41. The latter is used as buffer volume of gaseous fluid to regulate the pressure of the process in the circuit of the NMR analysis device 7.

At the outlet of the storage unit 41, the high-pressure gaseous fluid M0 is divided into three gaseous flows M1, M2, M3 of high-pressure fluid. Each of these high-pressure gaseous flows M1, M2, M3 then passes through the cryostat 8, notably the first exchanger 18, the probe 9 and the cryorefrigerator 11, according to the same process implemented notably in the second embodiment of the NMR analysis device 7.

In the sixth embodiment of the device 7, the temperatures at the different stages of progress of the gaseous fluid M0 in the circuit of the device 7 are as follows:
 at the outlets f, g, h of the first heat exchanger 18, the lowered temperature of the high-pressure gaseous flows M1, M2, M3 lies between 10 and 14 K;
 at the outlet a of the first exchanger 18, the low-pressure gaseous flow M7 has a temperature which has increased to lie between 277 and 317 K;
 downstream of the sample-holder and upstream of the cryorefrigerator 11, the temperature of the low-pressure gaseous fluid M6 lies between 13 and 17 K, and
 at the outlet of the cryorefrigerator 11, the low-pressure gaseous flow M7 has a lowered temperature lying between 7 and 11 K.

The low-pressure gaseous flow M7 then passes through the hot compression module 10 in which it is compressed so as to relate at the output of this compression module 10 to a high-pressure gaseous fluid M0.

In a second mode of operation, the valves A2, A3, A4, A5 are configured in closed mode and the other valves are configured in open mode.

Consequently, such a configuration of the valves then means that:
 the gaseous flow M8 of cryogenic fluid emanating from the cryogenic fluid source 40 cannot enter into the circuit of this NMR analysis device 7 via the looping element A2;
 the compression module 10 and the third exchanger 17 are isolated from the rest of the circuit by the closure of the valves A5 and A4, and
 the gaseous flow M7 originating from the first exchanger 18 is discharged from the circuit to the outside environment 44 via the looping element A1.

Thus, since the looping elements A5 and A4 are closed and the looping element A1 is open, the NMR analysis device 7 is in a configuration in which the circuit corresponds to a single open loop. The refrigeration and the motorization of the sample-holder are produced by this single open loop.

In this mode of operation, the high-pressure fluid storage unit 41 is used as reserve capable of diffusing into the circuit of the device 7 the gaseous fluid which is stored therein, by ensuring the flow rate of this fluid in the loop in the place of the hot compression module 10. Three high-pressure gaseous flows M1, M2, M3 originating from this storage unit 41 are conducted to the cryostat 8 in order to pass through it according to a process of travel through the circuit of the NMR analysis device 7 substantially similar to that implemented in the first mode of operation.

In the present mode of operation, the cryorefrigerator 11 ensures the drop in temperature of the gaseous flows M1, M2, M3 to a cryogenic temperature.

At the outlet of the cryostat 8, the gaseous fluid M7 is discharged by the looping element A1 to the outside environment 44, since the looping element A5 is in closed mode. Thus, the gaseous fluid is used with loss until the storage unit 41 is completely emptied thereof.

In a third mode of operation, the valves A4, A5, A6 are configured in closed mode, the other valves being in open mode.

Consequently, such a configuration of the valves then means that:
 the gaseous flow M8 of cryogenic fluid emanating from the cryogenic fluid source 40 can enter into the circuit of this NMR analysis device 7 via the looping element A2;
 the compression module 10 and the third exchanger 17 are isolated from the rest of the circuit by the closure of the valves A5 and A4, and
 the gaseous flow M4, recovered downstream of the rotor 31 and the stator 30 of the sample-holder 12, is discharged from the circuit to the outside environment via the looping element A3, because the looping element A6 is in closed mode.

Thus, since the valves A4, A5, A6 are closed and the looping elements A2, A3 are open, the NMR analysis device 7 is in a configuration in which the circuit corresponds to a double open loop. The refrigeration and the motorization of the sample-holder are produced by this double open loop.

In this mode of operation, the high-pressure fluid storage unit 41 is used as reserve capable of diffusing into the circuit of the device the gaseous fluid which is stored therein, by ensuring the flow rate of this fluid in the loop in the place of the hot compression module 10. Three high-pressure gaseous flows M1, M2, M3 originating from this storage unit 41 are conducted to the cryostat 8 in order to pass through it according to a process of travel through the circuit of the NMR analysis device 7 substantially similar to that implemented in the first and second modes of operation.

In this third mode of operation, the low-pressure gaseous flows M5, M4 are recovered respectively at the outlet of the stator 30 and rotor 31 of the sample-holder 12 corresponding to the flows resulting from the high-pressure gaseous flows M1, M2, M3. These gaseous flows M4, M5 form a gaseous flow M6 which is then discharged via the looping element A3 to the outside environment in the form of the gaseous fluid M9. Thus, the gaseous fluid is used with loss until the storage unit 41 is completely emptied thereof. In this mode of operation, no gaseous flow passes through the cryorefrigerator 11 unlike in the first and second modes of operation.

However, in a manner substantially similar to the first and second modes of operation, a heat transfer 33 is produced in the first heat exchanger 18 between two fluids, that of the low-pressure gaseous flow M7 and of the high-pressure gaseous flows M1, M2, M3. This heat transfer 33 induces a cooling of the high-pressure gaseous flows M1, M2, M3.

In this third mode of operation, this gaseous flow M7 corresponds to the gaseous flow M8 of cryogenic fluid which originates from the cryogenic fluid source 40 and which enters into the circuit of this NMR analysis device 7, via the looping element A2. This gaseous flow M8 of cryogenic fluid has a temperature lying between 3 and 7 K.

Subsequently, at the outlet of the cryostat 8, after having passed through the first exchanger 18, the gaseous flow M7 is discharged via the looping element A1 to the outside environment, since the looping element A5 is in closed mode. Thus, the gaseous flow M7 is used with loss until the cryogenic fluid source 40 is completely emptied thereof.

As has been seen previously, the fourth mode of operation is implemented by the seventh and eighth embodiments of the device 7.

In this fourth mode of operation, the valves A6, A5, A8 are configured in closed mode, and the other valves of the device 7 are in open mode.

Consequently, such a configuration of the valves then means that:

the gaseous flow M8 of cryogenic fluid emanating from the cryogenic fluid source 40 can enter into the circuit of this NMR analysis device via the looping element A2, to be discharged to the outside environment 44 via the looping element A1;

the fourth channelling element 23 is isolated from the rest of the circuit by the closure of the valves A6 and A5, and the gaseous flow M9 resulting from the low-pressure gaseous flows M4, M5 recovered respectively downstream of the rotor 31 and of the stator 30 of the sample-holder 12, is conducted to the compression module 10 following the sixth channelling element 26 by passing through the looping element A3, because the valves A6 and A8 are in closed mode.

Thus, since the valves A6, A5, A8 are closed and the other valves and/or redirection elements, of the seventh and eighth embodiments, are open, the NMR analysis device 7 is in a configuration in which the circuit corresponds to a double loop closed in the high-pressure part and open in the low-pressure part of the NMR analysis device 7. The high-pressure part corresponds to the channelling elements 27, 20, 21, 22 included between the compression module 10 and the sample-holder 12. The low-pressure part corresponds to the fourth channelling element 23 included between the sample-holder 12 and the compression module 10.

The refrigeration and the motorization of the sample-holder are produced by this double open/closed loop.

In this mode of operation, the gaseous fluid M0 will undergo a compression from the compression module 10 which defines the flow rate of the gaseous fluid M0 in this circuit.

This gaseous fluid originating from the compression module 10 is conducted to the sample-holder 12 according to a process of travel through the circuit of the NMR analysis device 7 substantially similar to that implemented in the first mode of operation.

In the present mode of operation, the gaseous flow M9, resulting from the low-pressure gaseous flows M4, M5 recovered respectively downstream of the rotor 31 and of the stator 30 of the sample-holder 12, is conducted by the seventh channelling element 26 and the looping element A3 to the hot compression module 10 notably because the valves A6, A8, A5 are in closed mode and the looping element A7 is in open mode. This gaseous flow M9 undergoes a new compression before being transmitted to the third exchanger 17, in the form of a high-pressure gaseous fluid M0 and thus producing a new thermodynamic cycle in the circuit of the NMR analysis device.

Subsequently, in a manner similar to the first, second and third modes of operation, a heat transfer 33 is produced in the heat exchanger 18 between two fluids, that of the low-pressure gaseous flow M7 and the high-pressure gaseous flows M1, M2, M3. This heat transfer 33 induces a cooling of the high-pressure gaseous flows M1, M2, M3.

In this fourth mode of operation, this gaseous flow M7 corresponds to the cryogenic flow M8 of cryogenic fluid, originating from the cryogenic fluid source 40, which enters into the circuit of this NMR analysis device 7, via the looping element A2.

Then, at the outlet of the cryostat 8, after having passed through the first exchanger 18, the gaseous flow M7 is discharged via the looping element A1, since the looping element A5 is in closed mode. Thus, the gaseous flow M7 is used with loss until the cryogenic fluid source 10 is completely emptied thereof.

In a fifth mode of operation, implemented by the eighth embodiment, the redirection elements VC1 to VC4 are activated and the valves A1, A2, A6 and A7 are configured in closed mode.

Consequently, such a configuration of these valves and redirection elements then means that:

the gaseous flows M1, M2, M3 originating from the heat exchanger 18 are redirected via the channelling element 29 to the inlet of the cryorefrigerator 11 then to the first exchanger 18, because the redirection elements VC1 to VC4 are activated;

the gaseous flow M7 originating from the cryostat 8 is conducted to the compression module 10, because the valves A1 and A7 are closed and the looping element A5 is open.

Thus, since the redirection elements VC1 to VC4 are activated and the valves A1, A7 are closed, the NMR analysis device 7 is in a configuration in which the circuit corresponds to a closed loop around the cryorefrigerator 11 and the first heat exchanger 18. When the redirection elements VC1 to VC3 are activated, the gaseous flows M1, M2, M3, originating respectively from the outlets f, g, h of the heat exchanger 18, are redirected to the inlet e of the first heat exchanger 18 by passing through the channelling element 29.

In effect, this mode of operation makes it possible to produce a short-circuit upstream of the cryorefrigerator 11, by the activation of the redirection elements VC1 to VC4 to maintain a permanent fluidic circulation and keep the cryostat 8 at low temperature in order to keep the refrigerating power instantly available to supply the NMR analysis probe 9.

Thus, it will be noted that one advantage of this mode of operation is the preservation of very low cryogenic temperatures in the NMR analysis device 7, notably in the cryorefrigerator 11 and in the mass of the first exchanger 18, when operations have to be performed on the device 7, in particular when changing samples or when servicing this device 7, particularly when the probe 9 has to be separated from the cryostat 8.

This makes it possible to lower the temperature again in a very short time.

Moreover, in the seventh and eighth embodiments, at the outlet of the cryostat 8 the cooled high-pressure gaseous flows M1, M2, M3 are conducted to the NMR analysis probe 9, from a cryogenic line 16. This cryogenic line 16 also conducts the gaseous flows M4, M5 via the valves A3 or A6 according to the mode of operation.

The device 7 further comprises a central processing unit, not represented, which comprises at least one computer and hardware and software elements for implementing steps of the method for operating the NMR analysis device 7.

This central processing unit, notably from the computer, is suitable for implementing a computer program comprising program code instructions for the execution of the steps of the method of operation as described previously.

This central processing unit is suitable for controlling the valves A1 to A11 and the redirection elements VC1 to VC4 so as to define different configurations of these elements according to the modes of operation to be implemented.

This central processing unit comprises a human-machine interface which makes it possible to control these various valves A1 to A1 and the redirection elements VC1 to VC4 and to fix setpoints of temperature and of speed of rotation of the sample-holder 12. The program implementing the steps of the method of operation is also capable of executing a step of isolating different parts of the NMR analysis device 7 such as the probe, the low- or high-pressure parts or even the compression module and the heat exchanger.

For that, the central processing unit acts notably on actuators controlling the valves A1 to A11 and the redirection elements VC1 to VC4, by sending commands via communication devices. In return, it receives values relating to the state of these elements, closed mode or open mode, measured by sensors and transmitted by the communication devices.

The invention claimed is:

1. NMR analysis device comprising an NMR analysis probe and a cryostat linked by a cryogenic line, the NMR analysis probe comprising
    a frame;
    a sample-holder comprising a rotor and a stator arranged in the frame, the sample-holder being suitable for receiving a sample of material to be analysed;
    a bearing arranged in the frame between the rotor and the stator for rotationally guiding the sample-holder relative to the frame;
    a compression module and a cryorefrigerator arranged in the cryostat, the cryorefrigerator being upstream of the compression module; and
    a first element for channelling a first gaseous flow of fluid to a turbine, a second element for channelling a second gaseous flow of fluid to the bearing, the bearing being an aerostatic or aerodynamic bearing, and a third element for channelling a third gaseous flow of fluid to the sample-holder, the function of the third gaseous flow being to cool the sample-holder and/or the sample,
    in the cryostat, a first heat exchanger in which the second and third gaseous flows transfer, respectively upstream of the bearing and of the sample-holder, heat (i) to a fourth gaseous flow downstream of the turbine or (ii) to a combined gaseous flow resulting from the second, third and fourth gaseous flows downstream of the turbine rotor and stator of the sample-holder, wherein the first gaseous flow does not transfer heat in the first heat exchanger.

2. The NMR analysis device according claim 1, comprising, in the cryostat, a second heat exchanger in which the first, second and third gaseous flows transfer heat to a heat exchange gaseous flow.

3. The NMR analysis device according to claim 2, wherein the first heat exchanger constituting an expansion unit is mounted so as to be kinematically linked with the sample-holder.

4. The NMR analysis device according to claim 3, wherein the cryorefrigerator is arranged between the first and second heat exchangers.

5. The NMR analysis device according to claim 3, comprising a fourth element for channelling the fourth gaseous flow of fluid downstream of the turbine.

6. The NMR analysis device according to claim 2, wherein the first and second heat exchangers are counter-current exchangers.

7. The NMR analysis device according to claim 3, which is configured to perform a Brayton thermodynamic cycle.

8. The NMR analysis device according to claim 3, wherein the turbine is an expansion turbine having a geometry allowing an isentropic expansion of the fluid which passes through the turbine.

9. The NMR analysis device according to claim 1, comprising a fourth element for channelling the combined gaseous flow of fluid downstream of the rotor and stator of the sample-holder.

10. The NMR analysis device according to claim 4, comprising a fourth element for channelling the fourth gaseous flow of fluid downstream of the turbine.

11. The NMR analysis device according to claim 3, wherein the exchangers are counter-current exchangers.

12. The NMR analysis device according to claim 4, wherein the exchangers are counter-current exchangers.

13. The NMR analysis device according to claim 5, wherein the exchangers are counter-current exchangers.

14. The NMR analysis device according to claim 10, wherein the exchangers are counter-current exchangers.

15. The NMR analysis device according to claim 4, which is configured to perform a Brayton thermodynamic cycle.

16. The NMR analysis device according to claim 5, which is configured to perform a Brayton thermodynamic cycle.

17. The NMR analysis device according to claim 6, which is configured to perform a Brayton thermodynamic cycle.

18. The NMR analysis device according to claim 10, which is configured to perform a Brayton thermodynamic cycle.

19. The NMR analysis device according to claim 11, which is configured to perform a Brayton thermodynamic cycle.

* * * * *